United States Patent [19]

Mierzwinski et al.

[11] 4,045,777

[45] Aug. 30, 1977

[54] REMOTE CONTROL TRANSMITTER AND RECEIVER FOR USE WITH A TELEVISION RECEIVER

[75] Inventors: Eugene P. Mierzwinski; David W. Worley, both of Fort Wayne, Ind.

[73] Assignee: The Magnavox Company, Fort Wayne, Ind.

[21] Appl. No.: 671,205

[22] Filed: Mar. 29, 1976

[51] Int. Cl.² .......................... H04B 9/00; H04Q 9/00
[52] U.S. Cl. ................................. 340/168 B; 325/392
[58] Field of Search ........................ 340/168 B, 171 R; 343/225, 228; 334/9; 325/391, 392

[56] References Cited

U.S. PATENT DOCUMENTS

| | | | |
|---|---|---|---|
| 3,248,730 | 4/1966 | Neumeyer | 334/9 X |
| 3,573,734 | 4/1971 | Williams et al. | 340/168 R |
| 3,651,469 | 3/1972 | Keese | 340/168 R |
| 3,806,939 | 4/1974 | Palmieri | 343/225 |
| 3,928,760 | 5/1974 | Isoda | 250/199 |
| 3,944,982 | 3/1976 | Mugi et al. | 340/171 R |

Primary Examiner—Donald J. Yusko
Attorney, Agent, or Firm—William J. Streeter; George R. Pettit

[57] ABSTRACT

A remote control transmitter and receiver for controlling all of the usual viewer-adjustable functions of a television receiver. A plurality of key/switches permit the viewer to select the channel to be tuned and the function to be controlled. Digital logic circuits generate pulse coded signals that identify channel numbers or controlled functions. Function level control pulses are generated by rotation of a code wheel connected to a thumb wheel to provide proportional control of selected functions. The pulse coded signals and function level control pulses are transmitted via an infrared optical link to the receiver where companion circuitry decodes the pulse coded signals and adjusts the levels of selected functions in response to the function level control pulses.

22 Claims, 13 Drawing Figures

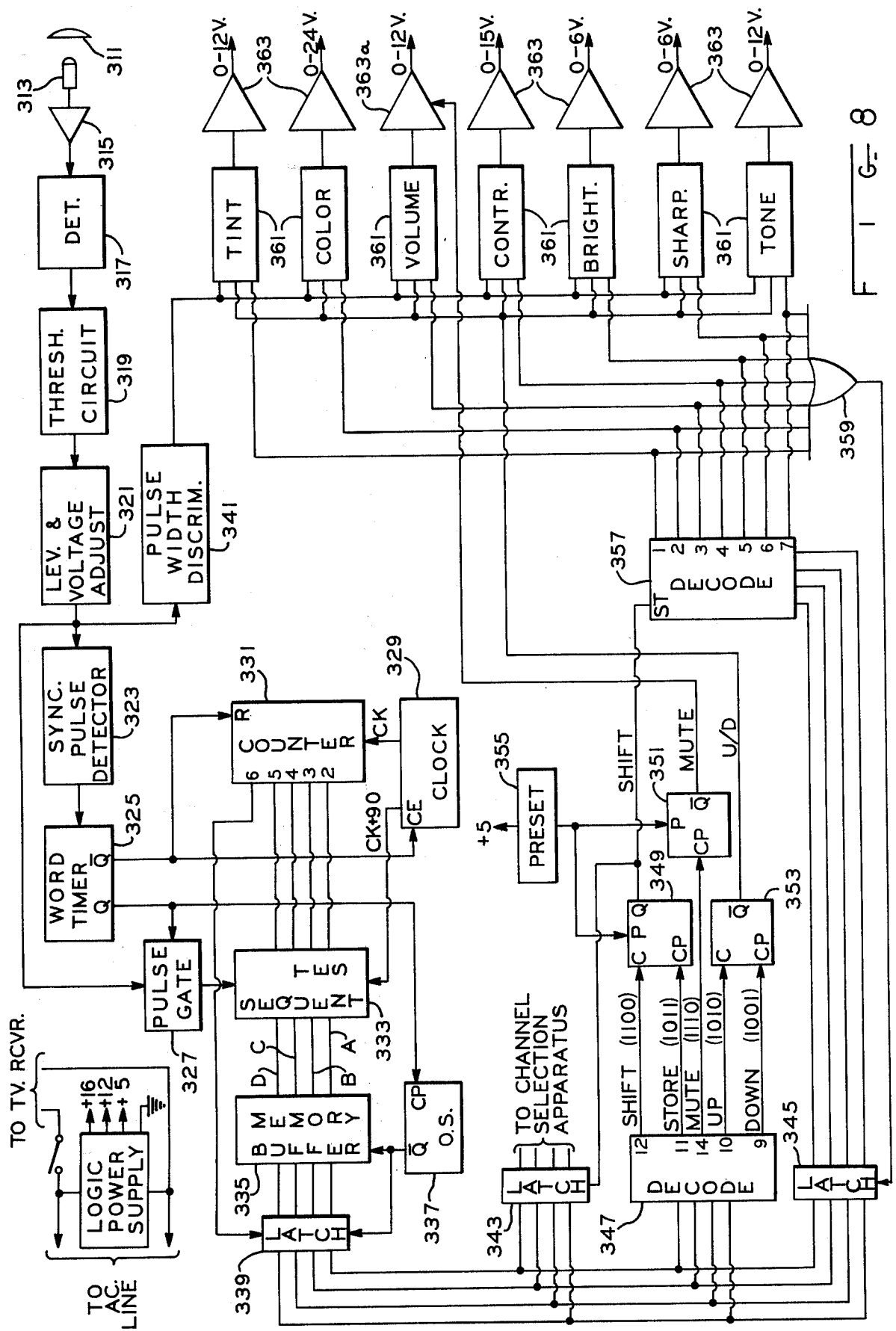
FIG_8

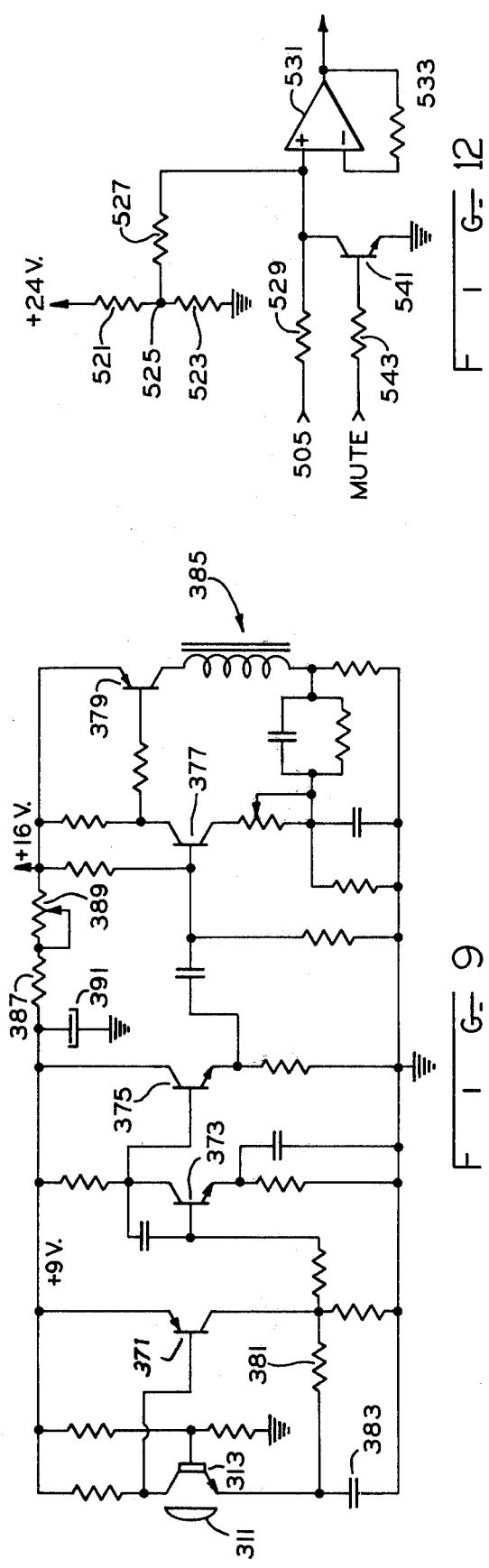
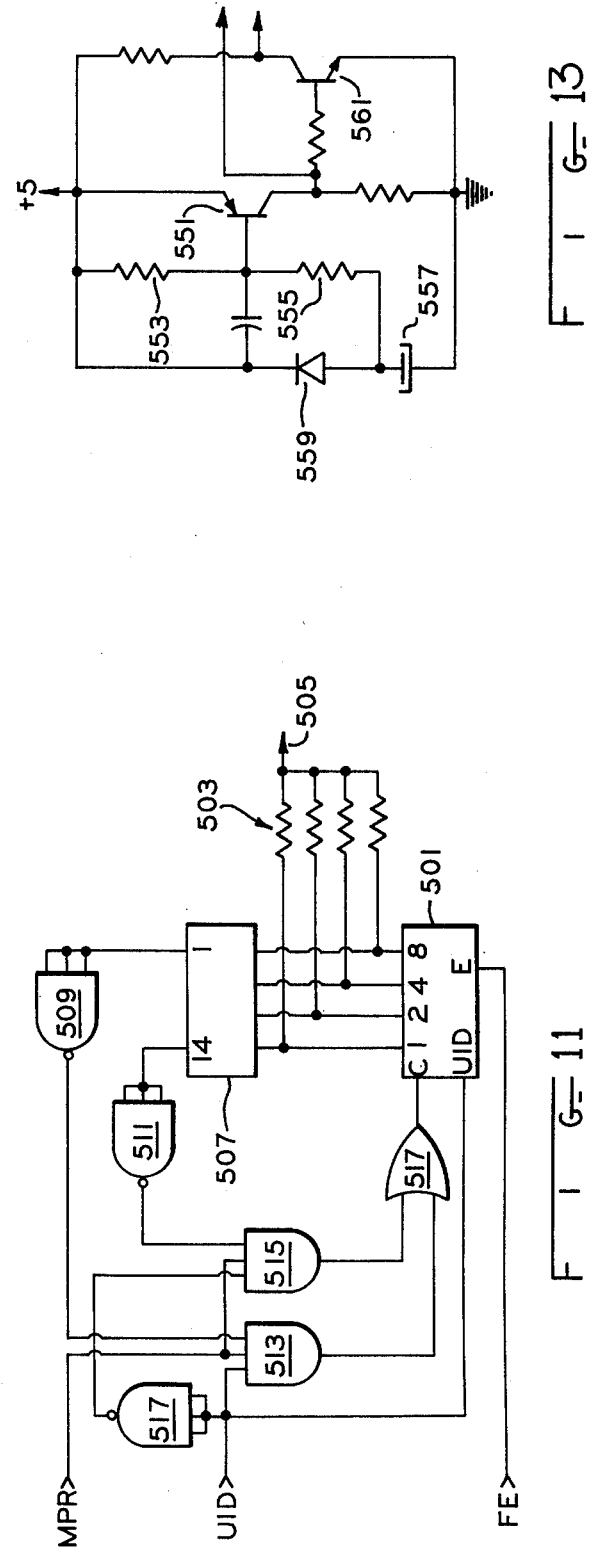

REMOTE CONTROL TRANSMITTER AND RECEIVER FOR USE WITH A TELEVISION RECEIVER

DESCRIPTION OF THE PRIOR ART

Prior art television remote control systems have utilized both ultrasonic and optical links. They have been used to control both channel selection and certain two-state functions such as on/off, and mute; and to control a few continuous functions, such as volume.

Channel selection and control of two-state functions have been satisfactory. However, control of continuous functions has not been satisfactory. This is because these functions have been controlled by motorized or electronic means responsive to the length of time a key on the transmitter is depressed. It is difficult to arrive at an optimum setting due to inertia of the driving motor, time lag of control response, and speed of adjustment. Some systems provide for adjustment in discrete steps, but these, too, have disadvantages such as coarseness of the steps and slow scan cycles.

It is desirable to provide a remote control for a television receiver that overcomes these shortcomings; one that provides for channel selection and control of a large number of functions, provides immediate response proportional control of selected functions, and is small, light weight, economical to manufacture, and reliable in operation.

SUMMARY OF THE INVENTION

The transmitter of the present invention comprises a keyboard having a plurality of key switches and a diode matrix for generating parallel binary coded signals in response to actuation of the key switches.

Parallel to serial conversion circuitry provides a sync signal and converts the parallel binary coded signals to serial binary coded pulses. These pulses are used to drive a light emitting diode which converts the electrical pulses into infrared light pulses for transmission to the receiver. The timing of the serial pulses is controlled by a digital clock having two outputs separated in phase by 90°. One clock output determines the successive time periods for transmitting the sync signal and the binary coded pulses. The other clock output limits the duration of each binary coded pulse to approximately 50 percent of the duration of its respective time period and centered therein.

Proportional control of selected functions is provided by a thumb wheel and associated circuits for generating function level control pulses in response to rotation of the thumb wheel. Direction detecting circuits detect the direction of rotation of the thumb wheel and cause a direction code to be generated and a pulse coded signal transmitted each time the direction of rotation is reversed. The circuits for generating and transmitting the pulse coded signals (channel select, function select, direction) are interconnected with the circuit for generating function level control pulses so that no function level control pulses will be gated to the light emitting diode during the gating and transmission of pulse coded signals.

For purposes of efficiency and cost of manufacturing, several of the key switches are made to perform both channel selection and function selection. This is achieved by using one key switch as a shift key and another as a return key in much the same manner as the FIGURES and LETTERS keys are used in teletype systems. That is, actuation of these keys does not alter the codes transmitted when other keys are depressed, but does alter how the codes are interpreted or decoded at the receiver.

By way of example, assume that the viewer depresses a key marked with the number "3" and the word "VOLUME." If the shift key has not been depressed, the code generated and transmitted when this key is depressed and released will be interpreted by the receiver as the number 3 and will be used to control the channel tuning system of the television receiver. If, on the other hand, the shift key has been depressed and released prior to depressing the key in question, the receiver will interpret the code as a function select code, and activate the volume control circuit in the receiver. Subsequent rotation of the thumb wheel will cause function level control pulses to be transmitted which the receiver will use to increase or decrease the volume level. Each reversal of the thumb wheel causes a direction code to be transmitted so that the receiver will adjust the volume in the proper direction in response to the pulses. When the selected function has been adjusted to the viewer's satisfaction, he depresses the return or store key, which returns the receiver to readiness to receive channel selection numbers.

The present invention provides a remote transmitter that is small and light weight. It may be designed to be hand held, or for setting on a table. The response of the receiver signals from the transmitter is so rapid that the viewer has the feel of instantaneous control. No time delay is noticeable between rotation of the thumb wheel and response of the selected function. The feel is the same as if the viewer were adjusting a control at the receiver.

Pulse coding eliminates the need for multiple frequency links between the transmitter and receiver. In addition, it substantially eliminates the possibility of false operation of the receiver.

it is therefore an object of the present invention to provide an improved remote control transmitter and receiver for selecting channels to be tuned and for controlling a large number of functions, such as volume, tone, color, tint, brightness, etc., and for providing proportional control of selected functions.

BRIEF DESCRIPTION OF THE DRAWINGS

FIG. 8 is a generalized block diagram of the receiver of the present invention.

FIG. 9 is a schematic diagram of the rf amplifier section of the receiver of the present invention.

FIG. 11 is a logic block diagram of the digital to analog converter utilized in the receiver of the present invention.

FIG. 12 is a schematic diagram of the function signal amplifiers in the receiver of the present invention.

FIG. 13 is a schematic diagram of a circuit for generating a preset pulse upon restoration of ac power to the television receiver.

DETAILED DESCRIPTION

Figure 1:
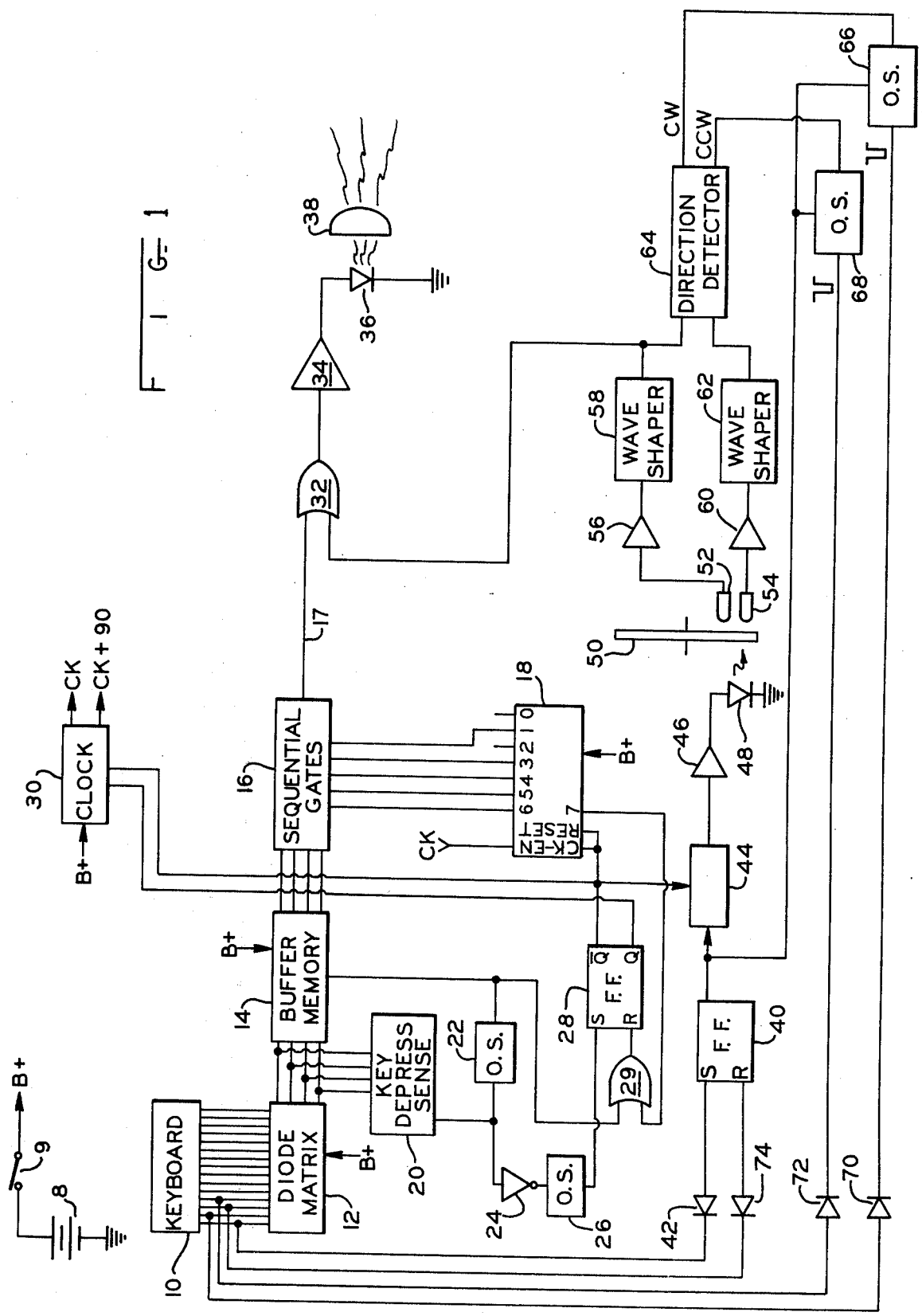
FIG. 1 is a generalized block diagram of the transmitter of the present invention.

Referring now to FIG. 1, there is shown a block diagram of the remote control transmitter of the present invention. A dry cell battery 8 and switch 9 provide the source of power (B+) for the transmitter. A keyboard 10 has a plurality of momentary contact key switches. A line from each key switch is connected to a diode matrix 12. Diode matrix 12 converts the signal from each key switch into a four-bit binary digit. It should be noted at this point that four binary bits are sufficient to provide control of all of the functions presently contemplated. However, should it be desired to remotely control a larger number of functions, the present invention comprehends the use of a larger number of binary digits.

Signals representing the four binary bits are presented in parallel to a buffer memory 14. The four parallel bits are converted to serial bits by sequential gates 16 which are gated by signals from a counter 18. Pulse signals representing the four binary bits plus a synchronizing pulse appear in predetermined time intervals on line 17.

A key depress sense circuit 20 connected to the outputs of diode matrix 12 produces an output signal whenever a key switch of keyboard 10 is depressed. The signal generated by key depress sense circuit 20 is connected to one shot 22 and through inverter 24 to one shot 26. The term "one shot" as used herein refers to a monostable multivibrator circuit that produces an output pulse of predetermined time duration in response to a change of state at its input. Thus, when key depress sense circuit 20 detects that a key switch has been depressed and its output changes state, one shot 22 provides a momentary pulse to buffer memory 14, momentarily clearing buffer memory 14 so that it may store the binary signals associated with the depressed key switch.

Due to the action of inverter 24, one shot 26 is not triggered until a depressed key is released. Upon release of a depressed key, one shot 26 provides a pulse to the set input(s) of a counter control flip flop 28. Flip flop 28 has two outputs. The first output $\overline{Q}$ is normally high and is connected to the clock enable (CK-EN) and reset inputs of counter 18. When flip flop 28 receives a pulse from one shot 26 at its set input, the $\overline{Q}$ output of flip flop 28 changes state from high to low and enables counter 18 to count clock pulses.

The clock pulses are generated in a clock 30 which will be described in more detail below. Clock 30 generates two clock signals which are substantially square waves displaced in phase by 90°. One clock signal is identified as CK and the other as CK + 90. The CK signal provides the clock input to counter 18.

Counter 18 is of the type generally referred to as a ring counter or Johnson counter. There are a plurality of outputs, each of which is high only during a predetermined time interval in a predetermined sequence. The particular counter used in the preferred embodiment has ten outputs which may be numbered zero through nine. When counter 18 is reset, output 0 is high. Upon counting a first clock pulse, output 0 goes from high to low and output 1 goes high. Upon counting a next clock pulse, output 1 goes low and output 2 goes high. This sequence continues until the counter is reset. In the present invention, only outputs, 1, 3, 4, 5, 6, and 7 are used. Outputs 1, 3, 4, 5, and 6 are used to gate sequential gates 16. Output 7 is connected to the reset (R) input of flip flop 28 through an OR gate 29 and is used to reset flip flop 28. This returns the state of the Q output of flip flop 28 from low to high which in turn disables counter 18 and resets it to zero.

The outputs 1, 3, 4, 5, and 6 of counter 18 sequentially enable sequential gates 16 to convert the parallel binary bits stored in buffer memory 14 to a serial binary signal plus a sync pulse on line 17. The serial binary signal is gated through OR gate 32 to oscillator/amplifier 34. Oscillator/amplifier 34 drives a light emitting diode (LED) 36 in response to the serial binary signal. The light energy emitted by LED 36 may be concentrated by a lens 38 for transmission to the remote control receiver located at the television receiver. Companion circuitry in the remote control receiver decodes the transmitted signal and executes the selected function.

As noted above, when counter 18 reaches the count of seven, the 7 output goes high and resets flip flop 28, which in turn resets couner 18 to 0. To insure that counter 18 will always be reset to 0 immediately before sequential gating and transmission of a binary number, the output of one shot 22 is also connected to the reset input of flip flop 28 through OR gate 29.

The remote control transmitter of the present invention provides for proportional control of selected functions. One of the key switches on keyboard 10 is identified as the SHIFT key. When this particular key is depressed, in addition to key depress sense circuit 20 being actuated, a flip flop 40 is set. The set (S) input of flip flop 40 is connected through diode 42 to a contact of the SHIFT key switch. A first output of flip flop 40 is connected through a gate 44 to an LED driver amplifier 46. When flip flop 40 is set, the first output goes high and causes amplifier 46 to energize LED 48.

A code wheel 50 has two concentric tracks each having a plurality of alternately spaced transparent and opaque regions. A light detector 52 detects light from LED 48 passing through the transparent regions of the first track and light detector 54 detects light from LED 48 passing through transparent regions of the second track. As code wheel 50 is rotated, a substantially square wave electrical signal is produced by each of the light detectors 52, 54. The relative positioning of the tracks on code wheel 50 and the light detectors 52, 54 is such that the two square waves are phase displaced by 90°. It should be noted that a single track could be used on code wheel 50 and the two detectors staggered to provide the 90° phase relationship between the two signals. Such structures are well known in the optical shaft encoding art.

The signals from light detector 52 are amplified by an amplifier 56 and processed by a wave shaper 58. The signals from light detector 54 are amplified by an amplifier 60 and processed by a wave shaper 62. The signals from light detectors 52 and 54 after passing through the amplifiers and wave shapers have a good square wave form. These two signals are connected to a direction detector 64 having two outputs labeled CW and CCW. When code wheel 50 is rotated in one direction, direction detector 64 produces an output signal at output CW. When code wheel 50 is rotated in the opposite direction detector 64 produces an output signal at output CCW.

Output CW is connected to a one shot 66 and output CCW is connected to a one shot 68. The output of one shot 66 is connected through a diode 70 to a terminal of a key switch on keyboard 10. The output of one shot 68 is connected through a diode 72 to a terminal of another key switch on keyboard 10. The outputs of one shots 66, 68 are normally high. When output CW of direction detector 64 goes high, indicating that the code wheel 50 is being rotated in one direction, the output of one shot 66 momentarily goes low and returns to high. The output of one shot 68 responds similarly to output CCW of direction detector 64.

It will be recalled that when a key switch on keyboard 10 is depressed, signals representing a binary number are stored in buffer memory 14. Upon release of the key switch, the binary signals stored in buffer memory 14 are sequentially gated to LED 36 and serially transmitted (pulse coded signals) in the form of light energy. Pulses generated by rotation of code wheel 50 (function level control pulses) are also transmitted by LED 36. This is provided by connecting the output of wave shaper 58 to a second input of OR gate 32. In order to prevent pulses generated by rotation of code wheel 50 from interfering with transmission of pulse coded signals corresponding to the binary number from buffer memory 14, the $\overline{Q}$ output of flip flop 28 is connected to gate 44. Gate 44 operates to block the output signal from flip flop 40 so that LED 48 is de-energized during transmission of the binary number stored in buffer memory 14.

Returning now to the operation of one shots 66 and 68, whenever the direction of rotation code wheel 50 is changed, one of the one shots 66, 68 will produce a momentary output signal. This momentary output signal has the same effect as if the key switch to which it is connected were momentarily depressed. That is, a binary number corresponding to that key switch will be stored in buffer memory 14 and sequentially gated through sequential gates 16 to LED 36. During the sequential gating and transmission of the binary number, gate 44 causes LED 48 to be de-energized, thereby preventing any pulses from being generated by rotation of code wheel 50. Upon completion of the sequential gating and transmission of the binary number, gate 44 is enabled to connect the output of flip flop 40 to amplifier 46 and re-energized LED 48. The time for these operations to occur is less than 20 milliseconds, and therefore unnoticed by the viewer operating the remote transmitter.

It was mentioned earlier that circuitry at the receiver decodes the transmitted binary signal and executes the function command. Each binary number, except the binary numbers associated with the SHIFT function and a STORE function may be used to identify two different commands in much the same manner as teletype signals do, depending upon whether they have been preceded by a SHIFT signal. In the preferred embodiment of the present invention, only the binary numbers associated with the channel selection digits zero through nine serve dual functions. The binary numbers associated with on/off, mute, and recall serve only the single function.

The receiver circuitry, which will be described in detail subsequently, is normally set to receive channel selection commands. Thus, a viewer may sequentially depress the key switches identified by the numbers 2 and 4, and the receiver circuitry will control the television tuning circuitry to tune to channel 24. If, however, the viewer first depresses the SHIFT key switch, the key switch identified by the numbers 2 and 4 will then identify the functions "color" and "contrast," respectively.

When the receiver circuitry receives a SHIFT command, its circuits are conditioned to receive a function command. Upon receipt of the function command, a bidirectional counter associated with that function is activated. Function level control pulses generated by code wheel 50 in response to rotating a thumb wheel are then used to count the selected function counter up or down. The numerical count in the function counter is converted by means of a digital to analog converter to a voltage signal that controls the selected function.

After a selected function has been adjusted by the viewer, he presses the STORE key. Pressing the STORE key causes a binary number to be transmitted which conditions the receiver circuitry to once again receive channel selection numbers or another function command. Also, the STORE key switch is connected to the reset (R) input of flip flop 40 through diode 74. When the STORE key switch is depressed, flip flop 40 is reset, de-energizing LED 48. Thus, by use of the keyboard and a single thumb wheel on the remote television trasmitter, a plurality of functions may be selected and proportionally controlled with the same feel as if the viewer were operating the controls directly at the television receiver.

Figure 3:
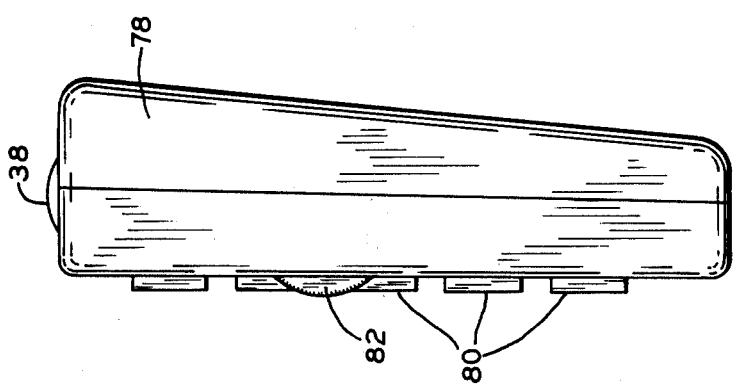
FIG. 3 is a right side view of the transmitter of the present invention.
Figure 2:
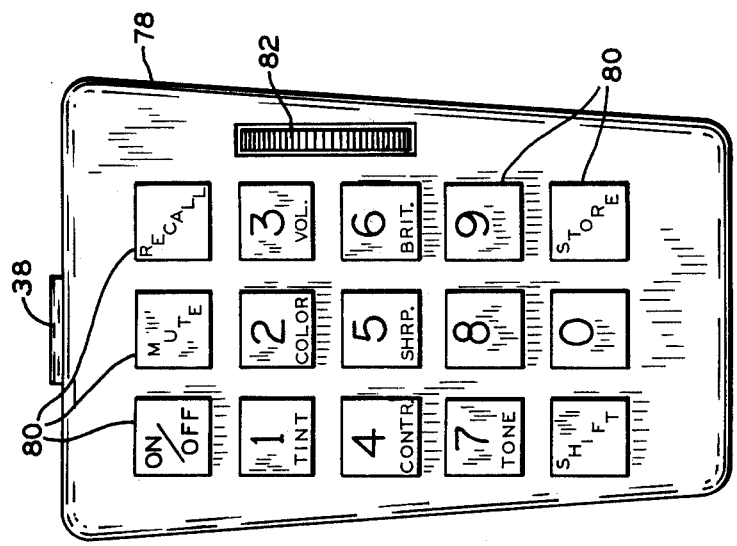
FIG. 2 is a front view of the transmitter of the present invention.

FIG. 2 shows a front view of the television remote control transmitter of the present invention. The transmitter is housed in a case or housing 78. A plurality of keys 80 and a thumb wheel 82 are mounted for operation by the viewer. The housing 78 also supports lens 38 and encloses all of the electronic circuitry of the transmitter and a dry cell or rechargeable battery for energizing the transmitter. The legends on the keys identify the channel selection numbers and the functions associated with each key. A right side view of the transmitter is shown in FIG. 3.

Figure 7:
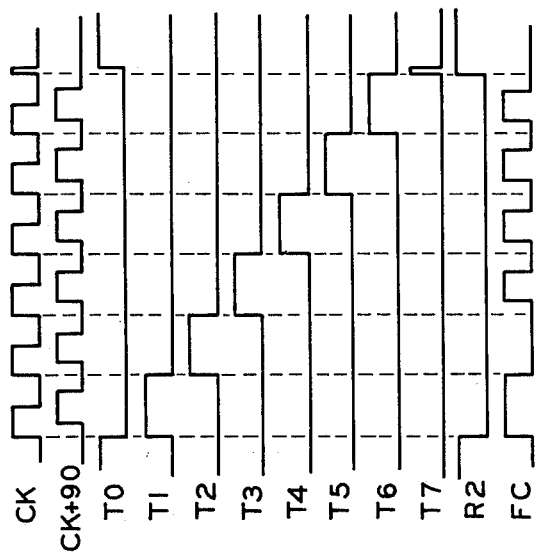
FIG. 7 is a graphical representation of several signal wave forms appearing at selected locations in the transmitter of the present invention.
Figure 4:
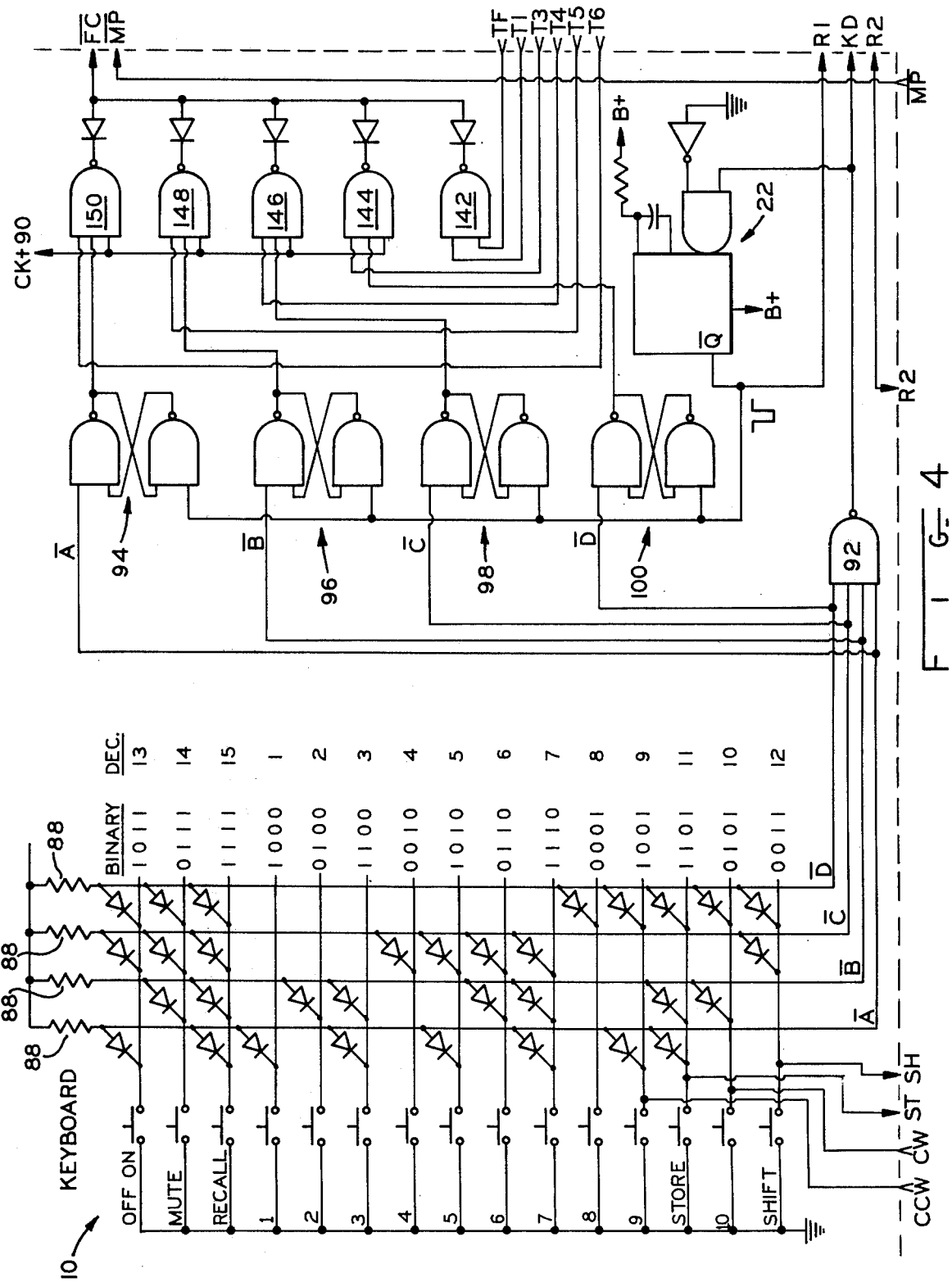
FIGS. 4, 5, and 6 are a detailed schematic and logic diagram of the transmitter of the present invention.
Figure 5:
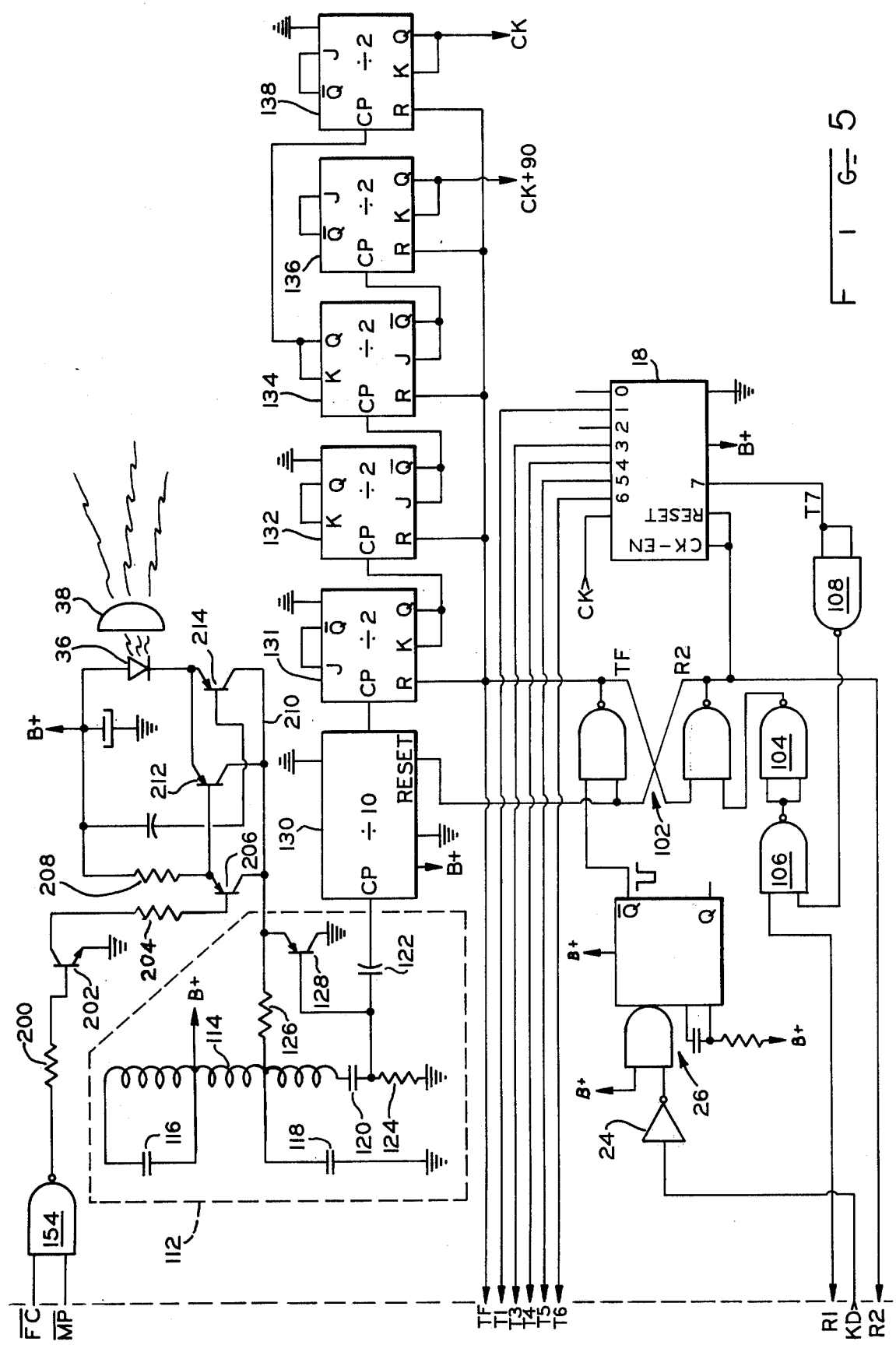
Figure 6:
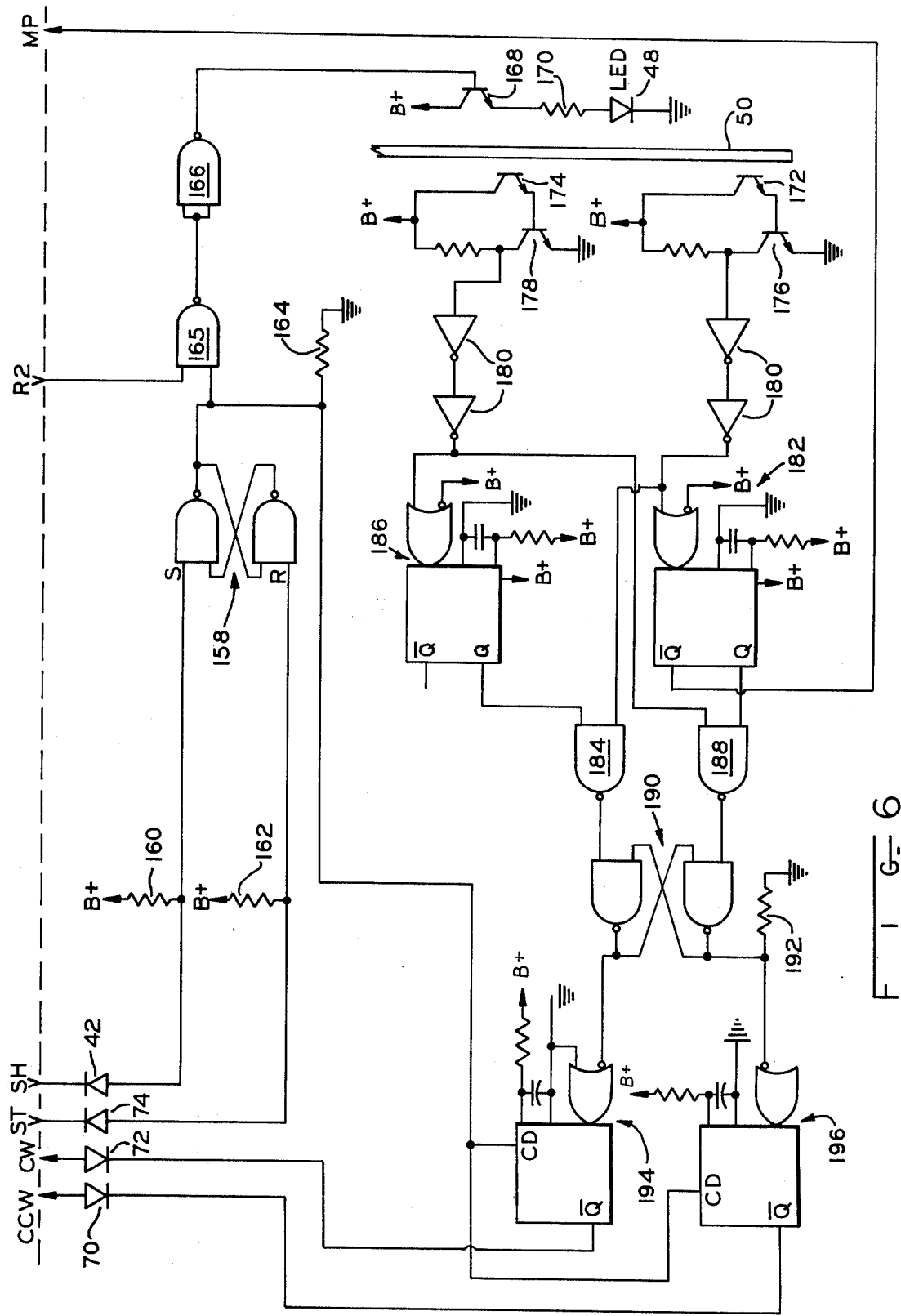

The detailed circuitry of the transmitter of the present invention which has been described in terms of the block diagram of FIG. 1 is shown in FIGS. 4, 5, and 6. Wave forms associated with the clock 30, sequential gates 16 and serial transmission of the function codes are shown in FIG. 7.

Referring now to FIG. 4, there are shown a plurality of key switches 86. Each key switch 86 is of the momentary contact type having one terminal connected to a common terminal or ground and the other terminal connected to a horizontal line of diode matrix 12. Each key switch 86 is associated with a channel selection number and/or function as indicated by the legends shown.

The horizontal lines of diode matrix 12 are connected by a plurality of diodes to vertical lines identified as $\overline{A}$, $\overline{B}$, $\overline{C}$ and $\overline{D}$. Each vertical line is also connected through a resistor 88 to a positive voltage souce indicated by B+. The placement and poling of the diodes is selected to provide a unique binary coded signal on the vertical lines, $\overline{A}$, $\overline{B}$, $\overline{C}$ and $\overline{D}$ in response to the operation of each key switch 86. The binary signals generated by depressing each key switch and their decimal equivalents are shown to the right of diode matrix 12 in FIG. 4.

In operation, when the B+ voltage is present, each of the vertical lines $\overline{A}$, $\overline{B}$, $\overline{C}$, and $\overline{D}$ will be high. That is, at substantially the B+ voltage. When a key switch 86 is depressed, a circuit is completed through its associated diodes to ground, allowing current to flow through the diodes to ground causing a voltage drop across the resistors 88 in the vertical lines to which diodes associated with that key switch are connected. Because the forward diode voltage drop is very low, substantially all of the voltage drop will appear across the resistors 88 and the vertical lines $\overline{A}$, $\overline{B}$, $\overline{C}$, or $\overline{D}$ will be pulled down to almost ground potential. This condition is referred to as low in contrast to a voltage stage at or near the B+ voltage which is referred to as high. By way of specific example, assume that the key switch associated with channel selection number 1 is depressed. This will allow current to flow through diode 90 causing vertical line $\overline{A}$ to go low. Vertical lines $\overline{B}$, $\overline{C}$, and $\overline{D}$ are unaffected and remain high. Thus, depressing this key switch generates the binary number 1000.

It should be noted at this point that the binary numbers shown to the right of diode matrix 12 in FIG. 4 appear in reverse order. That is, the least significant digit is to the left and the most significant digit is to the right. Also, the binary signals on the vertical lines are inverted from their customary representation. For this reason, these lines have been identified by the inverse symbols, $\overline{A}$, $\overline{B}$, $\overline{C}$, and $\overline{D}$ rather than A, B, C, and D.

Each of the line $\overline{A}$, $\overline{B}$, $\overline{C}$, and $\overline{D}$ is connected to one input of a four-input NAND gate 92. The operation of a NAND gate is such that when all inputs are high, its output will be low. If any input is low, its output will be high. Depressing a key switch 86 will cause at least one of the inputs to NAND gate 92 to go low. Therefore, when any key switch 86 is depressed, the output of NAND gate 92 will go high, indicating that a key switch has been depressed. NAND gate 92 corresponds to the key switch sense circuit 20 of FIG. 1.

Buffer memory 14 comprises four pairs of NAND gates 94, 96, 98, and 100. Each of these pairs of NAND gates is cross coupled to form a bistable or flip flop circuit. Each of the lines $\overline{A}$, $\overline{B}$, $\overline{C}$, and $\overline{D}$ provide one input to each cross coupled pair. The other input to each pair is provided by one shot 22 which may comprise a standard integrated circuit such as a type 74C221 which is readily available from a number of suppliers and is described in the catalogues and manuals of those suppliers. The output of NAND gate 92, identified as KD, provides the input to one shot 22. The output of one shot 22 is taken at the $\overline{Q}$ terminal and is identified as R1. R1 is normally high. When KD goes high, indicating that a key switch has been depressed, R1 momentarily goes low and returns high. The length of time R1 remains low is determined by the values of the external resistor and capacitor connected to the 74C221 device. The momentary excursion of R1 clears any number previously stored in the cross coupled pairs of NAND gates 94, 96, 98, and 100 of buffer memory 14 and upon return to its normal high state, the binary number associated with the newly depressed key switch is stored.

Referring now to FIG. 5, there is shown one shot 26 which may also be a 74C221 device. Inverter 24 is an integral part of the 74C221 device. The input to one shot 26 is provided by the key depress signal KD. The output of one shot 26 is taken at the $\overline{Q}$ terminal of the 74C221 device and is connected to one input of a flip flop comprising a pair of cross coupled NAND gates 102 corresponding to flip flop 28 of FIG. 1. The other input of the cross coupled NAND gate pair is taken from the output of a NAND gate 104 connected as an inverter. The input to NAND gate 104 is taken from the output of a two-input NAND gate 106. One input to NAND gate 106 is provided by the output of one shot 22 identified as R1. The other input of NAND gate 106 is taken from the output of a NAND gate 108. NAND gates 104, 106, and 108 cooperate to provide an OR logic function and collectively correspond to OR gate 29 of FIG. 1.

It has been determined that several milliseconds are required for a user to depress and release a key switch 86. The time constant of one shot 22 is selected to be approximately 5 microseconds. Thus, in terms of the operating speeds of these circuits, long before the key switch can be released, R1 has made an excursion from high to low and returned to high. The low excursion of R1 causes the output of NAND gate 106 to go high, which in turn causes the output of NAND gate 104 to go low. The output of one shot 26 is high during this time. Therefore, the cross coupled pair of NAND gates 102 will be switched to the state wherein the output of the lower NAND gate of the pair is high and the output of the upper NAND gate of the pair is low. The output of the upper NAND gate of the pair 102 is identified as TF and the output of the lower NAND gate of the pair 102 is identified as R2. This output is connected to the clock enable (CK-EN) and reset inputs of counter 18. Counter 18 may be an integrated circuit device such as a 5617A which is readily available from a number of suppliers and is described in the catalogues and manuals of those suppliers. A high level signal at the clock enable and reset terminals resets counter 18 to zero and prevents clock pulses from being counted.

Upon release of the key switch that has been depressed, the $\overline{Q}$ output of one shot 26 makes a momentary excursion to the low level. This changes the state of the cross coupled NAND gate pair 102, causing the output of the lower NAND gate (R2) to go low and the output of the upper NAND gate (TF) to go high. When R2 goes low, counter 18 is enabled to count clock pulses CK. As explained in connection with FIG. 1, the output terminals of counter 18 sequentially go high and return to low in response to clock pulses. The outputs used for sequential gating are identified as T1, T3, T4, T5 and T6.

Before continuing the detailed description and operation of the sequential gating circuitry, the clock 30 will be described in detail. Clock 30 comprises a master clock 112 enclosed within the broken line box of FIG. 5. Master clock 112 comprises a tapped inductor 114, capacitors 116, 118, 120, and 122, resistors 124 and 126, and a PNP transistor 128 connected as shown in FIG. 5. This combination of components operates as a relatively stable oscillator. A DC path is provided from B+ through the middle portion of inductor 114, resistor 126, and the emitter-collector circuit of transistor 128 to ground. Feedback is provided by the induced voltage in the lower portion of inductor 114 and is coupled to the base of transistor 128 through capacitor 120. Capacitors 118, 120, and 122 operate primarily as DC blocking capacitors. The frequency of oscillation of master clock 112 is primarily determined by the induction of inductor 114 and the capacitance of capacitor 116. In the preferred embodiment, component values are selected to provide an operating frequency of approximately 34.15KHz.

Master clock 112 provides the clock input to a ÷10 circuit 130, which may be an integrated circuit device MM4617. Circuit 130 provides a single output pulse for every ten input pulses received at its CP input. The output of circuit 130 provides the CP input to a ÷2 circuit 131 which may be a JK flip flop comprising one-half of an integrated circuit device type 74C73. Circuit 131 provides an output pulse for every two input pulses received at its CP input. The output of circuit 131 provides the CP input to another ÷ circuit 132. Circuit 132 provides an output pulse for every two input pulses received at its CP input. The output of circuit 132 provides the CP input to another ÷2 circuit 134. Circuit 134 also provides one output pulse for every two input pulses received at its CP input. Circuits 136 and 138 are also JK flip flops and may be provided by the two JK flip flops packaged in one 74C73 device. The CP input of circuit 136 is taken from the $\overline{Q}$ output of circuit 134 and the CP input to circuit 138 is taken from the Q output of circuit 134. The Q and $\overline{Q}$ outputs of circuit 134 are 180° out of phase. Because circuits 136 and 138 are edge-triggered devices, their respective outputs will be 90° out of phase. Thus, it will be seen that circuits 130, 131, 132 and 134 successively provide divisions by 10, 2, 2, and 2; or a total division of 80. Therefore, the frequency of the Q and $\overline{Q}$ outputs of circuit 134 will be the frequency of the master clock divided by 80, or approximately 427Hz. Each of the circuits 136 and 138 provide an additional ÷2 function on the outputs of circuit 134. Therefore, the outputs of circuit 136 and 138 each have a frequency equal to the frequency of the master clock divided by 160, or approximately 213Hz. The Q outputs of each of these circuits is used, the output of circuit 138 being identified as CK and the output of circuit 136 being identified as CK + 90. The shape and phase relationship of these signals are illustrated in FIG. 7.

Returning now to the detailed description of counter 18, the output signals T0 through T7 are illustrated below the CK and CK + 90 signals in FIG. 7 along with the R2 and FC signals. As described above, when a key switch is depressed R1 goes momentarily low. This insures that cross coupled NAND gate pair 102 will be driven to the state wherein R2 is high and TF is low. R2 is connected to the reset and clock-enable inputs of circuit 130. When R2 is high, circuit 130 is held in the reset mode and provides no output pulses. TF is connected to the reset (R) inputs of circuits 132, 134, 136, and 138. When TF is low, these circuits are disabled. Upon release of the depressed key switch, R2 goes low and TF goes high. This simultaneously enables all of the clock circuits 130, 132, 134, 136, and 138, and also enables counter 18. The master clock is running whenever B+ is present. Just prior to this instant, counter 18 has been held in the reset condition wherein output T0 is high. When R2 goes low, clock pulses CK and CK + 90 are generated by clock 30 and the CK pulses are counted by counter 18. The resulting output signals of counter 18 are shown in FIG. 7. It will be noted that output signal T7 returns to a low level almost immediately after it goes high. This is because T7 is used to reset cross coupled NAND gates 102 causing R2 to go high and reset counter 18 to zero.

Referring once again to FIG. 4, there are shown sequential gates 16 which comprise NAND gates 142, 144, 146, 148, and 150. NAND gate 142 has two inputs, TF and T1. NAND gate 144 has three inputs, T3, D, and CK + 90. NAND gate 146 has three inputs, T4, C, and CK + 90. NAND gate 148 has three inputs, T5, B, and CK + 90. NAND gate 150 has three inputs, T6, A, and CK + 90.

It will be recalled that TF is high during sequential clocking and transmission of a function code. Therefore, the output of NAND gate 142 will be low during the period when T1 is high. At all other times, the output of NAND gate 142 will be high. The outputs of NAND gates 144, 146, 148, and 150 will be high at all times except during coincidence of their respective inputs T1, T3, T4, T5, and T6 being high at the same time CK + 90 is high.

During these respective time periods, the respective outputs are under the control of the binary numbers stored in buffer memory 14, that is, the states of outputs D, C, B, and A, respectively. By way of illustration, assume that the RECALL key switch has been depressed. This will cause the binary number 1111 to be stored in buffer memory 14. Each of the outputs D, C, B, and A will be high. Therefore, as T3, T4, T5, and T6 sequentially go high, the outputs of NAND gates 144, 145, 148, and 150 will go low sequentially, but only during those portions of the respective time periods when CK + 90 is high.

The inclusion of the CK + 90 signal at this point makes the duration of each data pulse equal to one-half the duration of each data period and centered within the data period. Because the data pulses do not occupy the full duration of the respective time periods, reliable operation may be achieved without the transmitter clock and the receiver clock running at precisely the same frequency. This is a particulary desirable feature for mass production of remote control transmitters and receivers because it opens up the manufacturing tolerances and allows any transmitter to be used with any receiver.

The output of each NAND gate 142, 144, 146, 148, and 150 is connected to the cathode of a diode. The anodes of the respective diodes for each NAND gate are all connected to a line identified as $\overline{FC}$. $\overline{FC}$ provides one input to a NAND gate 154 shown on FIG. 5. NAND gate 154 operating with inverted input signals performs a logic OR function and corresponds to OR gate 32 shown in FIG. 1. The other input to NAND gate 154 is identified as $\overline{MP}$, the generation of which will now be described.

Referring now to FIG. 6, there is shown a pair of cross coupled NAND gates 18 corresponding to flip flop 40 of FIG. 1. The upper input is identified by S, and the lower input is identified by R. The S input is connected through diode 42 to one terminal of the SHIFT key switch. The R input is connected through diode 74 to one terminal of the STORE key switch. For ready identification of these lines between FIGS. 4 and 6, they are respectively identified as SH and ST.

It will be recalled that when any key switch is depressed, a binary number is stored in buffer memory 14 and when the key switch is released the number is sequentially gated to LED 36. In addition, when the SHIFT key switch is depressed, the S input to cross coupled NAND gate pair 158, which is normally biased high by resistor 160, goes low. The R input of cross coupled NAND gate pair 158 is normally biased high by resistor 162. The output of the upper NAND gate of cross coupled pair 158 is connected through a resistor 164 to ground. The purpose of resistor 164 is to initialize the state of cross coupled pair 158 so that when B+ voltage is turned on, the output of the upper NAND gate will be low and the output of the lower NAND gate will be high. This is the condition that prevails after the STORE key switch has been momentarily depressed. When the SHIFT key switch is depressed, the S input of cross coupled pair 158 will momentarily go low and the R input will stay high. This input condition will cause the output condition to reverse. That is, the output of the upper NAND gate of cross coupled pair 158 will go high and the output of the lower NAND gate of cross coupled pair 158 will go low. The output of the upper NAND gate of cross coupled pair 158 provides one input to a NAND gate 165. The other input to NAND gate 165 is provided by R2. The output of NAND gate 165 is connected to the input of a NAND gate 166. NAND gate 166 has its inputs connected together and operates as an inverter.

When the output of the upper NAND gate of cross coupled pair 158 goes high, the output of NAND gate 165 will go low, providing R2 is also high. When this condition exists, the output of NAND gate 166 will go high. It will be understood by persons skilled in the art that NAND gates 165 and 166 cooperate to perform a logic AND function corresponding to gate 44 of FIG. 1.

The output of NAND gate 166 is connected to the base of an NPN transistor 168. The collector of transistor 168 is connected to B+. The emitter of transistor 168 is connected through a current limiting resistor 170 to the anode of LED 48. The cathode of LED 48 is connected to ground. Transistor 168 corresponds to amplifier 46 of FIG. 1. Because the output of NAND gate 166 is either high or low, transistor 168 is operated either in the saturated or cutoff condition. When the output of NAND gate 166 is high, transistor 168 is driven into saturation, allowing current to flow through LED 48. When the output of NAND gate 166 is low, transistor 168 is biased to cutoff and no current flows through LED 48.

LED 48 is mounted adjacent code wheel 50 having two code tracks as described above in connection with FIG. 1. As code wheel 50 is rotated, light from LED 48, assuming LED 48 is energized, is allowed to pass through the transparent regions of the first code track to a phototransistor 172 and through the transparent regions of the second code track to a phototransistor 174. The outputs of phototransistors 172 and 174 are amplified by transistors 176 and 178, respectively, connected as common emitter amplifiers. These amplifiers correspond to amplifiers 56 and 60 of FIG. 1.

The output of transistor 176 is taken at its collector and connected through wave shapers 180 to the input of a one shot 182 and to one input of a NAND gate 184. The astable period of one shot 182 is approximately 1 millisecond. The output transistor 178 is taken at its collector and is connected through wave shapers 180 to the input of a one shot 186 and to one input of a NAND gate 188. The astable time period of one shot 186 is also approximately 1 millisecond. Wave shapers 180 may be of the Schmidth trigger type available in the integrated circuit device 74C14. One shots 182 and 186 may be integrated circuit devices of the type SLC4528A. Both of these integrated circuit devices are readily available from a number of suppliers and are described in their respective catalogues and manuals.

As described above in connection with FIG. 1, the positional relationships between the two code tracks of code wheel 50 and the phototransistors is such tht two square waves are produced, phase displaced by 90°. Thus, when code wheel 50 is rotated in one direction, the square wave produced by phototransistor 172 will lead the square wave produced by phototransistor 174. Conversely, when code wheel 50 is rotated in the opposite direction, the square wave produced by phototransistor 172 will lag the square wave produced by phototransistor 174. As a result of the cross coupling of these signals to one shots 182, 186, and NAND gates 184, 188, rotating code wheel 50 in one direction will cause pulses to appear only at the output of NAND gate 184 while rotation of code wheel 50 in the opposite direction will cause pulses to appear only at the output of NAND gate 188.

The outputs of NAND gates 184 and 188 provide the two inputs to a cross coupled pair of NAND gates 190. It should be noted that the outputs of NAND gates 184 and 188 are normally high, and the pulse outputs appear as momentary excursions to the low level. Thus, pulses from NAND gate 184 will cause the cross coupled pair 190 to assume the state wherein the output of the upper NAND gate is high and the output of the lower NAND gate is low. If the rotation of the code wheel is reversed, the output of NAND gate 184 will remain high while pulses appear at the output of NAND gate 188. This will cause the cross coupled NAND gates 190 to change state so that the output of the lower NAND gate is high and the output of the upper NAND gate is low. A resistor 192 is coupled between the output of the lower NAND gate of the cross coupled pair 190 and ground. The purpose of resistor 192 is to initilize the state of cross coupled pair 190 when B+ is turned on. Thus, when B+ is turned on, and before any pulses are gated by NAND gate 184 or NAND gate 188, the cross coupled NAND gates 190 will be initialized with the output of the lower NAND gate of the cross coupled pair low and the output of the upper NAND gate of the cross coupled pair high. If we identify the direction of rotation of code wheel 50 that causes pulses to appear at the output of NAND gate 184 as clockwise, then resistor 192 initilizes the cross coupled pair 190 in the state we have identified as clockwise.

The output of the upper NAND gate of cross coupled pair 190 is connected to the input of a one shot 194. The output of the lower NAND gate of the cross coupled pair 190 is connected to the input of a one shot 196. One shots 194 and 196 may be of the same type as one shots 182 and 186. The $\overline{Q}$ output of one shot 194 is connected through diode 72 to one terminal of the clockwise (CW) key switch. The $\overline{Q}$ output of one shot 196 is connected through diode 70 to one terminal of the counterclockwise (CCW) key switch.

Whenever the direction of rotation of code wheel 50 is reversed, the $\overline{Q}$ output of one shot 194 or 196 will momentarily go low. This has the same effect as if one of the respective key switches had been momentarily depressed. That is, the binary number corresponding to that key switch is stored in buffer memory 14 and sequentially gated to LED 36. The R2 signal from the lower NAND gate of cross coupled pair 102 connected to the second input of NAND gate 165 prevents pulses from being generated by rotation of the code wheel 50 and interfering with serial transmission of the binary number associated with the CW or CCW key switch. Since R2 is low during sequential gating and transmission of a function code, the output of NAND gate 165 is maintained high during that time. This, in turn, maintains the output of NAND gate 166 low, keeping LED 48 de-energized during sequential gating and transmission of a function code.

The function level control pulses for incrementing the function counters at the receiver are taken from the $\overline{Q}$ output of one shot 182. The $\overline{Q}$ output of one shot 182 is connected over the line identified as $\overline{MP}$ to the second input of NAND gate 154 as shown in FIG. 5. $\overline{MP}$ is normally high and makes a 1 millisecond excursion to the low level once during each rotation of code wheel 50 by an amount equal to one opaque region and one transparent region. $\overline{FC}$ will be high except during transmission of a function code. Therefore, each time $\overline{MP}$ goes low, the output of NAND gate 154 will go high. Likewise, $\overline{MP}$ will be high while the function code pulses are being sequentially gated on line $\overline{FC}$. Therefore, each time $\overline{FC}$ goes low, the output of NAND gate 154 will go high.

Referring to FIG. 5, the output of NAND gate 154 is connected through a resistor 200 to the base of an NPN transistor 202. The emitter of transistor 202 is connected to ground, while the collector of transistor 202 is connected through a resistor 204 to the base of a PNP transistor 206. The emitter of transistor 206 is connected through a resistor 208 to B+. The collector of transistor 206 is connected to a line 210. The anode of LED 36 is connected to B+. The cathode of LED 36 is connected to line 210. The collectors of transistors 212 and 214 are connected to line 210. The bases of transistors 212 and 214 are connected to the emitter of transistor 206.

In operation, transistor 206 is normally cutoff. Transistors 212 and 214 are biased to cutoff by resistor 208. The output of NAND gate 154 is normally low. When the output of NAND gate 154 is low, transistor 202 is cut off presenting a high impedance path between the base of transistor 206 and ground. For the duration of each pulse, the output of NAND gate 154 is high. During this time, transistor 202 is caused to conduct and presents a low impedance path from the base of transistor 206 to ground. This causes transistor 206 to conduct. When transistor 206 conducts, the bases of transistors 212 and 114 are pulled down, causing transistors 212 and 214 to conduct. Transistors 212 and 214 operate in parallel to conduct current through LED 36.

If line 210 were connected directly to ground, current would flow steadily through LED 36 for the duration of each pulse at the output of NAND gate 154. However, line 210 is not connected to ground, but rather is connected to the emitter of transistor 128. It will be recalled that transistor 128 is part of the master cock 112 and is switched or chopped at an r.f. frequency of approximately 34.15KHz. Thus, although transistors 212 and 214 are biased to conduct for the duration of the pulse at the output of NAND gate 154, the current through LED 36 is chopped at the master clock frequency by transistor 128. Since the clock pulses CK have a frequency of 1/160 of the master clock frequency, each sync pulse comprises approximately 160 pulses of light at a pulse rate of 34.15KHz. Since each data pulse lasts only 50 percent of the CK (or CK + 90) signal, each data pulse comprises approximately 80 pulses of light at a pulse rate of 34.15KHz. Each function level control pulse, which has a duration of approximately 1 millisecond, comprises approximately 34 pulses of light at a pulse rate of 34.15KHz.

Driving LED 36 at the master clock frequency permits the use of AC amplifiers and tuned circuits in the receiver. The principle advantages of this arrangement are that transmitter power is used more efficiently and the receiver can be made very selective to signals from the transmitter. Although background radiation may be present in the environment of the television receiver, it is very unlikely that any radiation other than that from the remote transmitter will be modulated at the master clock frequency. This, taken with the serial pulse coded transmission of the function codes substantially eliminates the possibility of false operation of the receiver due to background noise or radiation.

It should be noted that a number of modifications can be made in the circuitry of the remote transmitter of the present invention without altering its basic operation. For example, the circuits could be connected to sequentially gate the function code directly from the diode matrix to the LED, thereby eliminating the buffer memory. Similarly, by the use of suitable one shots, gating and transmission of function codes could be controlled using only the leading edge, or key switch closing signal, eliminating the use of the trailing edge or key switch opening signal. This could easily be accomplished by connecting KD to the non-inverting input of one shot 26 and changing its time delay accordingly.

Referring now to FIG. 8, there is shown a generalized block diagram of the remote control receiver of the present invention. A logic power supply 301 provides the required voltages for the various circuit elements of the receiver. A lens 311 gathers light energy from the remote control transmitter and directs the light upon the light-sensitive surface of a photodetector 313. The photodetector 313 converts the received light energy into electrical energy in th form of an output signal which is connected to an rf amplifier 315. It will be recalled that the light signals from the remote control transmitter are chopped at 34.15KHz.

The rf signal from amplifier 315 provides the input to an envelope detector 317. Envelope detector 317 removes the 34.15KHz carrier frequency and provides an output that substantially reproduces the modulating pulses. The output of detector 317 provides the input to the hthreshhold circuit 319. Threshhold circuits 319 operate to reject signals below a predetermined threshhold level. The output of threshhold circuits 319 provides the input to level and voltage adjust circuits 321. Level and voltage adjust circuits 321 convert the reference level and voltage excursion of the pulse signai from threshhold circuits 319 to match the input requirements of TTL integrated circuit devices which are used extensiely throughout the remander of the preferred embodiment.

The output of level and voltage adjust circuits 321 is connected to a sync pulse detector 323. Sync pulse detector 323 rejects pulses having less than a pedetermined duration, e.g., 3.5 milliseonds. The format of the transmitted signal is a sync pulse of approximately 4.68 milliseconds duration followed by one or more data pulses having a duration of approximately 2.34 milliseconds. When sync pulse detector 332 detects the presence of a sync pulse in the received signal, it triggers a word timer 325. Triggering actually occurs at the trailing edge of the detected sync pulse, which is substantially coincident with the beginning of the empty data period. Word timer 325 has two outputs, one indicated as Q and the other as $\overline{Q}$. Prior to receiving a trigger signal from sync pulse detector 323, the $\overline{Q}$ output is high and the Q output is low. Upon receiving a trigger signal from sync pulse detector 323, $\overline{Q}$ goes low and Q goes high for a predetermined time period and then return to their former states. The predetermined time period is approximately 23 milliseconds, approximately equal to the time of the following five data periods.

The Q output of word time 325 provides one input to a data pulse gate 327. The other input of pulse gate 327 is provided by the output of level and voltage adjust circuit 321. Pulse gate 27 operates to pass pulses from the output of level and voltage adjust circuits 321 when the Q output of word timer 325 is high, and to block signals from level and voltage adjust circuits 321 when the Q output of word timer 325 is low. Thus, pulse gate 327 is enabled to pass pulses for the predetermined transmission time following detection of a sync pulse.

The $\overline{Q}$ output of word timer 325 is connected to the clear-enable (CE) input of a digital clock 329. Digital clock 329 has two outputs indicated at as CK and CK + 90, and is substantially the same as clock 30 of the remote transmitter described above. So long as the $\overline{Q}$ output of word timer 325 is high, clock 329 is held in a cleared and off state. When the $\overline{Q}$ output of word timer 325 goes low, clock 329 is enabled and produces the CK and CK + 90 output signals. Because word timer 325 is triggered at the trailing edge of the detected sync pulse, clock 329 is enabled simultaneously with the beginning of the empty data period following the sync pulse. Thus, clock 329 will be substantially synchronized with clock 30. Precise synchronism is not necessary, however, because only the central 50% of each data period is used for data pulses.

The CK clock signal provides the input to a counter 331. Counter 331 is of the same types as counter 18 of the remote transmitter described above, and operates in the same manner. Outputs 1, 2, 3, and 4 of counter 331 are connected to sequential gates 333. The output of pulse gate 327 is also connected to sequential gates 333 as is the CK + 90 output of clock 329. The outputs of sequential gates 333 are identified as A, B, C, and D. The function of sequential gates 333 is to steer the data pulses of a serial data pulse train from pulse gate 327 sequentially to lines A—D. Lines A—D provide the inputs to a buffer memory 335.

The Q output of word timer 325 is also connected to the CP input of a one shot 337. The $\overline{Q}$ output of one shot 337 is normally high while the Q output is normally low. When the Q output of word timer 325 goes high, the leading edge triggers one shot 337, causing its $\overline{Q}$ output to go low and its Q output to go high for a short time, approximately 5 microseconds. The $\overline{Q}$ output of one short 337 is connected to buffer memory 335 and operates to clear buffer memory 335 of any previous number stored therein prior to receiving a new command number on lines A-D. The $\overline{Q}$ output of one shot 337 is also connected to the clear input of a 4-bit latch 339 and operates to clear latch 339 of any number previously stored therein.

Output 6 of counter 331 is connected to the strobe input of latch 339. Thus, after outputs 2, 3, 4, and 5 of counter 331 have sequentially gated data pulses through sequential gates 333 to buffer memory 335, output 6 of counter 331 strobes latch 339 to store therein the binary number received in buffer memory 335. The $\overline{Q}$ output of word timer 335 is also connected to the reset (R) input of counter 331. Thus, when word timer 325 times out, counter 331 is reset to zero. It will be understood by persons skilled in the art that the foregoing described circuitry detects and receives serial pulse coded light signals from a remote control transmitter, converts the light signals to electrical signals, converts serial binary pulses to parallel signals stored in buffer memory 35, and stores them in latch 39.

As described above in connection with the remote transmitter of the present invention, the signals transmitted by the remote control transmitter are of two kinds. The first kind has been described above and consists of a sync pulse plus a data pulse train. The sync pulse has a duration of approximately 4.68 milliseconds and each data pulse has a duration of approximately 2.34 milliseconds. The other kind of signal comprises pulses of a shorter duration than the data pulses, approximately 1millisecond. These pulses are used to provide proportional control of selected functions. Although they have a fixed duration of approximately 1 millisecond, they occur at random intervals as determined by the television viewer's operation of the thumb wheel on the remote control transmitter. A pulse width discriminator circit 341 receives its input from the output of level and voltage adjust circuits 321 and allows to pass to its output only pulses having a duration of aproximately 1millisecond. The function of pulse width discriminator 341 is to pass only function level control pulses while blocking noise and pulse coded signals (channel select, function select, direction).

It should be re-emphasized at this point that the apparatus of the present invention is not limited to four data bits. The techniques and circuitry of the present invention may be expanded to encompass any size data word that is required to uniquely identify each of the function desired to be controlled.

Referring once again to FIG. 8, the output of 4-bit latch 339 is connected to the input of a 4-bit latch 343, to the input of a 4-bit latch 345, and to the input of a 4-to-16 decoder 347. Only five outputs of decoder 347 are used. These are the binary 9, 10, 11, 12, and 14 outputs. These are shown in FIG. 7 and labeled DOWN, UP, STORE, SHIFT, MUTE, respectively. The SHIFT and STORE outputs of decoder 347 are connected to the C and CP inputs respectively of a flip flop 349. The MUTE output is connected to the CP input of a toggle flip flop 351. The UP and DOWM outputs are connected to the inputs of a flip flop 353.

The presence of a SHIFT code in latch 339 causes the SHIFT output of decoder 347 to go high ans set flip flop 349. The Q output of flip flop 349 is connected to one control input of latch 343 and operates to disable the outputs of latch 343 when it is high and to enable the outputs of latch 343 when it is low. The outputs of latch 343 are connected to channel selection apparatus and on/off control such as a known control identified as the Magnavox Star System, which is described in an article in the December, 1974 issue of Radio-Electronics magazine starting at page 44.

It will be understood that receipt of a SHIFT code disables latch 343 and subsequent receipt of a STORE code re-enables latch 343. Receipt of a MUTE code causes flip flop 351 to toggle. Thus, receipt of successive MUTE codes will alternately cause the television receiver volume to be muted and un-muted. Receipt of an UP code will cause the $\overline{Q}$ output of flip flop 353 to go low while receipt of a DOWN code will cause the $\overline{Q}$ output of flip flop 353 to go high.

In normal operation, the television receiver having the remote control circuitry of the present invention remains continuously connected to the AC power source. In order to insure that flip flops 349 and 351 are properly initialized after loss of AC power, a preset signal generating circuit 355 is provided to generate a momentary output upon restoration of AC power. The output of preset circuit 355 is connected to the preset inputs of flip flops 349 and 351. Flip flop 349 will be preset so that its Q output is low and flip flop 351 will be preset so that its $\overline{Q}$ output is low. Thus, upon restoration of AC power, the circuitry will be conditioned to receive channel selection commands rather than function commands and the volume will be un-muted. A presently preferred embodiment of preset circuit 355 is shown in FIG. 13 and will be described subsequently.

The outputs of 4-bis latch 345 are connected to the inputs of a 4-to-16 decoder 357. The Q output of flip flop 349 is connected to the ST input of decoder 357. Decoder 357 is enabled when its ST input is high and disabled when its ST input is low. Thus, after a SHIFT command has been received, the binary signals 0001, 0010, 0011, 0100, 0101, 0110, and 0111 will be decoded by decoder 357 as TINT, COLOR, VOLUME, CONTRAST, BRIGHTNESS, SHARPNESS and TONE, respectively, as indicated in FIG. 7. All of these outputs are connected to the inputs of an OR gate 359 which has its output connected to a control input of 4-bit latch 345. Thus, so long as any one of the named outputs of decoder 357 is high, the output of OR gate 359 will be high and will lock up latch 345. Latch 345 will be released only when a STORE code is received causing Q output of flip flop 349 to go low and in turn disabling the outputs of deocder 357.

Each of the utilized outputs of decoder 357 is connected to one of a plurality of function modules 361. Each of the function modules also has connected to it the output of pulse width discriminator 341 and the output of flip flop 353. Each function module 361 contains an up/down counter and a digital-to-analog converter for producing a DC voltage corresponding to the count in its up/down counter. The state of the output of flip flop 353 determines whether the selected up/down counter will count up or down. When the output of flip flop 353 is low, the counters are steered to count up, and when the output of flip flop 353 is high, the counters are steered to count down. Th clock inputs of the counters are provided by the output from pulse width discriminator 341. Only one function module 361 will be activated at any given time as determined by the output of decoder 357. It should be noted that all of the function modules 361 are identical and provide a DC output current of 0 to 0.41 ma in response to counts of 0 to 63 in their respective up/down binary counters.

The current output of each function module 61 is connected to an operational amplifier 363. Each operational amplifier 363 is selected to have a gain such that its output voltage will be suitable for the function to be controlled and will provide the proper range of control voltage in response to the current output of its function module 361. All of the amplifiers 363 are identical (except for the values of input and feedback resistors) with the exception of amplifier 363a which is used to provide the volume control signal. Each of these amplifiers and their differences will be described in detail subsequently.

Referring now to FIG. 9, there is shown a detailed schematic diagram of amplifier 315. Amplifier 315 comprises five transistor amplifier stages having transistors 371, 373, 375, 377, and 379 connected as shown in FIG. 9. Transistor 371 cooperates with photosensitive transistor 313 to form a DC coupled feedback amplifier. The RC network consisting of resistor 381 and capacitor 383 reduces the gain of the amplifier at low frequencies. Careful selection of these two components renders the amplifier insensitive to frequencies below 27KHz. The presently preferred values are 27K for resistor 381 and 0.0068μf for capacitor 383. Transistors 373, 375, and 377 provide additional gain. Transistor 379 operates as a bandpass amplifier to provide additional frequency selection. Total amplification gain is approximately 129db at 34.15KHz.

Amplifier 315 is inductively coupled to detector 317 by means of a transformer 385. The primary winding of transformer 385 is connected in the collector circuit of transistor 379 as shown in FIG. 9. The operation of the various biasing and load resistors and the coupling and bypass capacitors will be understood by persons skilled in the art. Resistor 387 and variable resistor 389 operate as voltage dropping resistors to provide approximately 9 volts for the operation of photo transistor 313 and transistors 371, 373, and 375. Capacitor 391 operates as a power supply filter and storage capacitor.

Figure 10:
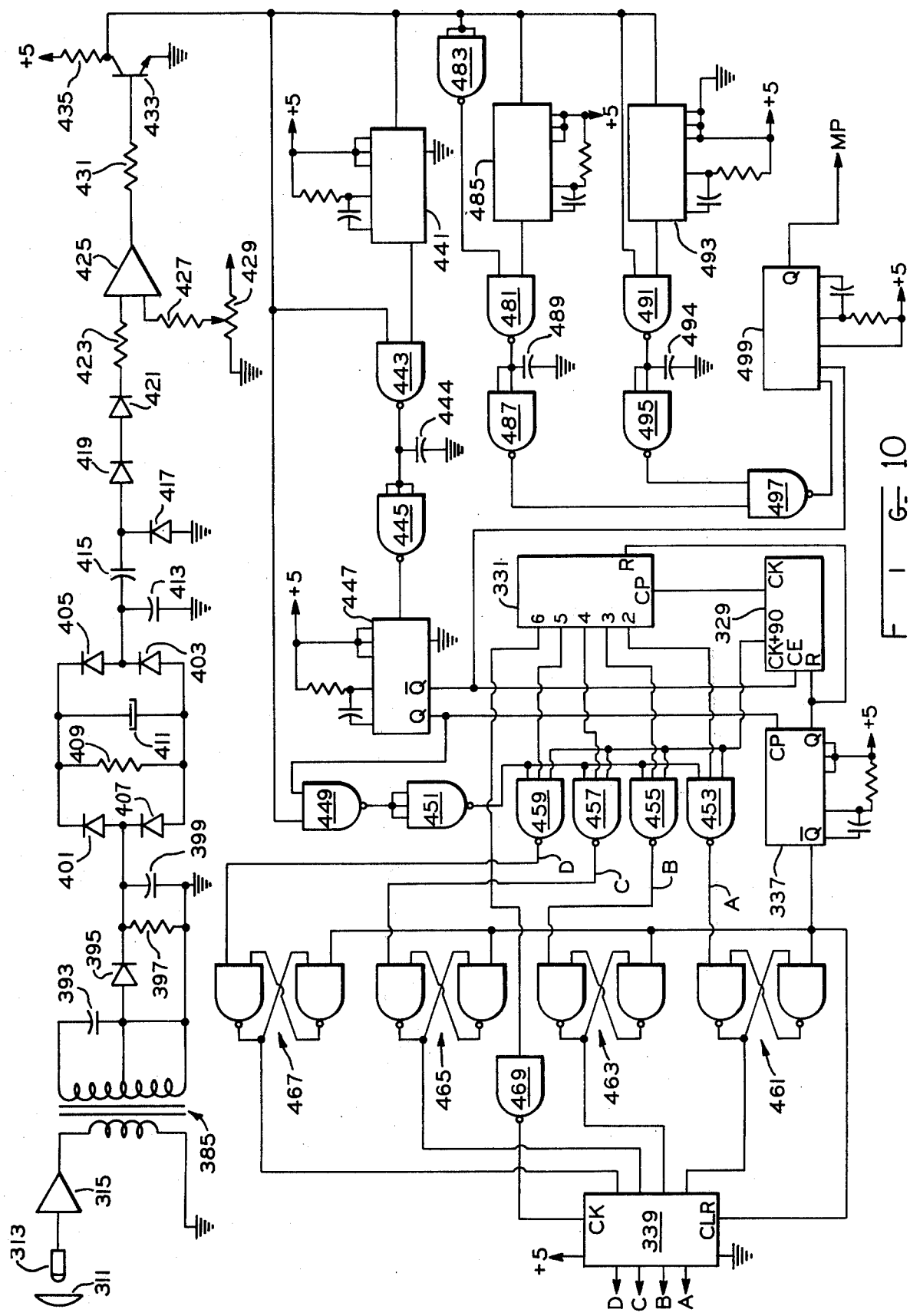
FIG. 10 is a schematic diagram of the detector, threshold and wave-shaping sections and a logic block diagram of the pulse processing portions of the receiver of the present invention.

Referring now to FIG. 10, lens 311, photo transistor 313, and amplifier 315 are illustrated diagrammatically. As was stated above, amplifier 315 is coupled to detector 317 by transformer 385. The priamry winding of transformer 385 is in the collector circuit of transistor 379, the last stage of amplifier 315.

A capacitor 393 is connected across the end terminals of the secondary winding of transformer 385. One of the end terminals is connected to the common terminal. A center tap on the secondary winding of transformer 385 is connected to the anode of a diode 395. The cathode of diode 395 is connected through the parallel combination of resistor 397 and capacitor 399 to the common terminal. Diode 395 operates as a detector to detect the envelope of the transmitted signal.

The envelope wave form is processed by a coring filter consisting of diodes 401, 403, 405, 407, resistor 409 and capacitor 411 connected as shown in FIG. 10. The output of the coring filter is AC coupled to a diode 417 by capacitor 415. Capacitor 413 provides a low impedance path to ground for noise and other high frequency components in the envelope wave form. Diode 417 opeates to further detect and clamp the envelope signal. The cathode of diode 417 is connected through forward poled diodes 419 and 421, and through resistor 423 to one input of differential operational amplifier 425. The other input of operational amplifier 425 is connected through resistor 427 to the wiper contact of a potentiometer 429.

As shown in FIG. 10, diode 395 and the circuit elements to the right thereof, over to and including capcitor 413, correspond to detector 317. Diodes 417, 419, snd 421 correspond to threshhold circuit 319. The operation of the above described receiver circuitry is as follows. The optical signals from the remote transmitter are received by photo transistor 313. It will be recalled that these signals are in the form of infrared light pulses chopped at 34.15KHz. Photo transistor 313 converts the optical signal to an electrical signal that is amplified by successive transistor amplifier stages including a final tuned amplifier stage utilizing transistor 379. This amplifier stage is tuned by the inductance of transformer 385 and the capacitance of capacitor 393. The envelope of the 34.15KHz signal is detected by diode 395. The envelope wave form, after detection, substantially duplicates the wave form of the pulses at the output of OR gate 32 in the transmitter. However, the envelope wave form contains high frequency components due to the 34.15KHz carrier and noise. Much of this noise is filtered out by the coring filter and the diode clamp and threshhold diodes. Operational amplifier 425 operates as a level detector and acts to square up the wave form. In order to provide better wave shaping, one or more additional operational amplifiers connected as level detectors may be cascaded with operational amplifier 425. The result is a wave form that reproduces the pulse wave form at the output of OR gate 32 of the remote transmitter, but inverted. This signal is connected by a resistor 431 to the base of a transistor 433. The collector of transistor 433 is connected through 435 to a source of plus 5 volts dc. The emitter of transistor 433 is connected to the common terminal. Transistor 433 and its associated resistors correspond to the level and voltage adjust circuit 321 illustrated in block diagram form in FIG. 7. The output from transistor 433 is taken at its collector. The signal at this point is a good reproduction of the signal at the output of OR gate 32 of the remote transmitter.

The collector of transistor 433 is connected to the input of a one shot multivibrator 441 and to one input of a two-input NAND gate 443. The $\overline{Q}$ output of one shot 441 is connected to the other input of NAND gate 443. One shot 441 may comprise one half of a standard integrated circuit of the type 74C221. One shot 441 is connected to be triggered by positive going signals and has an astable time period of 3.5 milliseconds. Thus, if the pulse that triggers one shot 441 has a duration less then 3.5 milliseconds, the output of NAND gate 443 will reman high. If the pulse that triggers one shot 441 lasts longer than 3.5 milliseconds, then both inputs to NAND gate 443 will be high simultaneously and its output will go low. A capacitor 444 is connected from the output of NAND gate 443 to ground to slow down the response of NAND gate 443 so that it will not respond to transient high input conditions that may occur because of differences in propagation times through NAND gate 443 and one shot 441. NAND gate 445 is connected as an inverter and takes its input from the output of NAND gate 443. The sync pulse is the only transmitted pulse that has a duration long enough to cause high coincidence at the inputs of NAND gate 443. Therefore, only a sync pulse will cause the output of NAND gate 445 to go high. One shot 441 and NAND gates 443 and 445 correspond to the sync pulse detector 323 of FIG. 8.

The output of NAND gate 445 is connected to the input of a one shot 447. One shot 447 is identical to one shot 441 except that the external resistor and capacitor are chosen to provide an astable time period of approximately 23 milliseconds. This is the approximate time of the five data periods following a sync pulse. One shot 447 corresponds to the word timer 325 of FIG. 8. The Q output of one shot 447 is connected to one input of NAND gate 449. The output of NAND 449 is connected to the inputs of NAND gate 451 which operates as an inverter. NAND gates 449 and 451 cooperate to provide a logic AND function and correspond to pulse gate 327 of FIG. 8. The $\overline{Q}$ output of one shot 447 is connected to the clear-enable (CE) input of clock 329.

Clock 329 is similar to clock 30 of the remote transmitter. A master oscillator provides high frequency pulses which are divided by a series of counters or dividers to drive a pair of flip flops that produce two substantially squre wave forms 90° out of phase. These are identified as CK and CK + 90. The counter-divider chain is mantained in a cleared and reset condition by the $\overline{Q}$ output of one shot 447. When the $\overline{Q}$ output of one shot 447 goes low, the counter chain is enabled and the CK and CK + 90 clock signals are generated. In this manner, the CK and CK + 90 signals from clock 329 are substantially synchronized with the corresponding signals in clock 30 of the remote transmitter.

The CK signal from clock 329 is connected to the CP input of counter 331. Counter 331 operates in the same manner as counter 18 of the remote transmitter. Because counter 331 does not begin receiving CK clock pulses until the end of the received sync pulse, it will be running one count behind counter 18 of the remote transmitter. During the first data period following the sync pulse, the 1 output of counter 331 will be high. However, this data period is always empty. Therefore, the 1 output of counter 331 is not used. The 2, 3, 4, and 5 outputs of counter 331 are connected respectively to one input of three-input NAND gates 453, 455, 457, and 459. A second input of each NAND gate 453-459 is connected to the output of NAND gate 451. A third input of each NAND gate 453-459 is connected to the CK + 90 clock signal from clock 329. Thus, it will be seen that NAND gates 453-459 operate in a manner similar to NAND gates 144-150 of the remote transmitter, but perform the reverse function. That is, NAND gates 453-459 sequentially gate the data pulses from NAND gate 451 to four different outputs. Thus, while NAND gates 144-150 of the remote transmitter operate to convert from parallel to serial, NAND gates 453-459 operate to convert from serial to parallel. NAND gates 453-459 correspond to sequential gate 333 of FIG. 8.

Four cross-coupled NAND gate pairs 461, 463, 465, and 467 operate as flip flops. One input of each cross-coupled NAND gate pair is connected to the $\overline{Q}$ output of one shot 337. The other input of each cross-coupled pair 461-467 is connected to the outputs of NAND gates 453-459, respectively. The input of one shot 337 is connected to the Q output of one shot 447. Thus, when one shot 447 is triggered by a sync pulse, its Q output triggers one shot 337 and the $\overline{Q}$ output of one shot 337 goes momentarily low. The astable time period of one shot 337 is approximately 5microseconds. In the same manner as described above in connection with the remote transmitter, the momentary low excursion of the $\overline{Q}$ output of one shot 337 clears and previous data out of the cross-coupled NAND gate pairs 461-467 so that they may receive new data from NAND gates 453-459. Cross-coupled NAND gate pairs 461-467 correspond to buffer memory 335 of FIG. 8.

The outputs of cross-coupled NAND gate pairs 461-467 provide the four steering inputs to 4-bit latch 339. The clock input of latch 339 is aken from the 6 output of counter 331 through a NAND gate 469 connected as an inverter. The clear input of latch 339 is connected to the $\overline{Q}$ output of one shot 337. Thus, latch 339 is cleared when cross-coupled NAND gate pairs 461-467 are cleared, and is strobed when counter 331 reaches the count of six. Thus, it will be seen that a 4-bit binary number is stored in latch 339 which corresponds to the 4-bit binary number generated by diode matrix 12 of the remote transmitter.

As mentioned above in connection with FIG. 8, pulse width discriminator 341 allows function level control pulses to pass, while blocking noise and pulse coded signals. The detailed construction of pulse width discriminator 341 is shown in FIG. 10 and will now be described. A two-input NAND gate 481 receives one input from the collector of transistor 433 through NAND gate 483 connected as an inverter. The other input of NAND gate 481 is taken from the Q output of a one shot 485 which also receives its input from the collector of transistor 433. One shot 485 is connected for triggering by positive going signals and has an astable timer period of approximately 1.5 milliseconds. The output of NAND gate 483 will be low for the duration of the pulse at its input. Therefore, if the pulse duration is greater than 1.5 milliseconds, the Q output of one shot 485 will have returned to a low level before the output of NAND gate 483 returns to a high level and the output of NAND gate 481 will reman high. If the duration of the pulse is less than 1.5 milliseconds, the output of NAND gate 483 will return high while the Q output of one shot 485 is still high, causing the output of NAND gate 481 to go low. Whenever the output of NAND gate 481 goes low, the output of NAND gate 487, connected as an inverter, will go high. A capacitor 489 connected between the output of NAND gate 481 and ground serves the same function as capacitor 444 described above.

A two-input NAND gate 491 receives one input from the collector of transistor 433. It receives its other input from the $\overline{Q}$ output of a one shot 493 which also receives its input from the collector of transistor 433 and has an astable time period of 0.5 milliseconds. A capacitor 494 between the output of NAND gate 491 and ground serves the same function as capacitor 444 described above. NAND gate 495 inverts the output of NAND gate 491. The operation of one shot 493 and its associated NAND gates is the same as the operation of one shot 441 and its associated NAND gates except for the astable time period selected.

A two-input NAND gate 497 receives its inputs from the outputs of NAND gates 487 and 495. In order for both inputs to NAND gate 497 to be simultaneously high, the pulse at the collector of transistor 433 must have a duration greater than 0.5 milliseconds and less than 1.5 milliseconds. When this situation exists, indicating the receipt of a function level control pulse, the output of NAND gate 497 goes low. The output of NAND gate 497 is connected to a one shot 499 which is connected to operate in response to a negative-going input. The astable timer period of one shot 499 is 1 millisecond. Thus, the Q output of one shot 499 will produce a positive 1 millisecond pulse each time the output of NAND gate 497 goes low. The signal from the Q output of one shot 499 is identified as MPR and, except for a slight time delay, is substantially identical to the signal $\overline{MP}$ (inverted) that is generated in the remote transmitter when the thumb wheel is rotated.

Referring now to FIG. 11, there is shown in more detail the circuitry of the digital-to-analog converters 361. A steerable up/down counter 501 has binary outputs weighted 1, 2, 4, and 8. A ladder resistance network 503 is connected to the outputs of counter 501. The values of the resistors in network 503 are selected, as is well known in the art, to provide current summation at terminal 505 corresponding to the binary number in counter 501. The remainder of the circuit elements of FIG. 11 are utilized to prevent counter 501 from counting above a predetermined maximum count and below a predetermined minimum count.

A 4-to-16 decoder 507 is also connected to the outputs of counter 501. Only the 1 and 14 outputs of decoder 507 are illustrated. It will be appreciated, however, that any two outputs could have been chosen for purposes of illustration. The 1 output is connected to the inputs of a NAND gate 509 connected as an inverter. The 14 output is connected to the inputs of a NAND gate 511 connected as an inverter. Two AND gates 513 and 515 each have three inputs. The first input of each gate is supplied from pulse width discriminator 341 with the received function level control pulses identified as MPR. The second input of AND gate 513 is supplied by the up/down signal U/D from flip flop 353. This signal is inverted by NAND gate 517 connected as an inverter and supplied to the second input of AND gate 515. The third input of NAD gate 513 is taken from the output of NAND gate 509 while the third input to AND gate 515 is taken from the output of NAND gate 511. The outputs of AND gates 513 and 515 are connected through OR gate 517 to the clock input of counter 501. The function enable (FE) signal is connected to the enable (E) input of counter 501.

The operation of the circuit of FIG. 11 is as follows. The received function control level pulses MPR are supplied to both AND gates 513 and 515. The outputs of NAND gates 509 and 511 are normally high. Thus, the state of the up/down signal U/D will normally determine which AND gate, 513 or 515, is enabled to pass function level control pulses MPR. When the up/down signal U/D is low, counter 501 is steered to count up, and AND gate 515 is enabled to pass the function control level pulses MPR. If counter 501 reaches the count of 14, the 14 output of decoder 507 will go high, causing the output of NAND gate 511 to go low and disable AND gate 515. This will block any further pulses MPR from reaching counter 501 and preventing counter 501 from counting any higher. When the up/down signal U/D is high, counter 501 is steered to count down and AND gate 513 is enabled to pass pulses MPR. If counter 501 is counted down to a count of 1, the 1 output of decoder 507 goes high causing the output of NAND gate 509 to go low and disable AND gate 513. Thus, in similar fashion, counter 501 is prevented from counting below a count of 1. It should be noted at this point that counter 501 is shown as a four stage counter for purposes of illustration only. In actual practice, it is desirable to use a counter with more stages to provide finer increments of adjustment for the controlled functions. A correspondingly larger resistance ladder network 503 would, of course, be used. It should also be noted that all of the digital-to-analog converters 361 simultaneously receive the function level control pulses MPR and the up/down signal U/D, but that the only digital-to-analog converter 361 that will be affected will be the one receiving a function enable signal FE from decoder 357.

Referring now to FIG. 12, there is shown the typical circuit connections for each operatonal amplifier 363. A pair of resistors 521 and 523 connected in series between a source of positive voltage (plus 24 volts inthe illustration) and ground provide a reference voltage at junction 525. Junction 525 is connected through a first current summing resistor 527 to the non-inverting input of an operational amplifier 531. The output of a digital-to-analog converter 361, indicated at terminal 505, is connected through a second summing resistor 529 to the non-inverting input of operational amplifier 531. A feedback resistor 533 is connected between the output of operational amplifier 531 and its inverting input. The particular values of resistance used will depend upon the particular characteristics of the operational amplifier used and the range of output voltage desired for a given range of input currents at terminal 505. Standard reference texts on operational amplifiers may be consulted to determine the specific resistance values to be used with particular operational amplifiers.

Amplifiers 361a for the volume control function differs from the other amplifier 361 by the addition of a transistor 541 and resistor 543 as shown in FIG. 11. When the MUTE signal from flip flop 351 is low, transistor 541 is cut off and has no effect on the operation of the circuit, allowing the current at terminal 505 to control the output of amplifier 531. However, when the MUTE signal is high, transistor 541 is saturated and provides a low resistance path to ground, draining the current from the summing junction and causing the output of amplifier 531 to go substantially to ground potential (OV).

Referring now to FIG. 13, the details of a preferred circuit for preset 355 are shown. Upon loss of AC power, the output of logic power supply 301 will drop to zero. Upon restoration of AC power, the logic power supply outputs will be restored. In order to assure the desired state of certain signals upon power restoration, e.g. the MUTE and SHIFT signals, a preset signal is produced and maintained until the logic power supply outputs have stabilized.

As the +5 supply is restored, a transistor 551 will conduct because its base will be at a lower potential than its emitter due to the operation of resistors 553 and 555 and capacitor 557. As capacitor 557 changes, the base potential of transistor 551 will rise, eventually reaching cutoff. This rise time is determined by the RC time constant of resistors 553 and 555 and capacitor 557, and is chosen to be long enough to allow power supply 301 to stabilize. Diode 559 provides rapid discharge of capacitor 557 on loss of power, insuring that momentary interruptions will cause the preset circuit to operate. A second transistor 561 connected as shown in FIG. 13 will conduct when transistor 551 conducts. When transistor 551 conducts, its collector is substantially at the same voltage as the +5 output of the logic power supply. When transistor 561 conducts, its collector is substantially at ground voltage. In the cutoff state, these conditions are reversed. Therefore, appropriate high and low level preset signals are available at the collectors of transistors 551 and 561, respectively, during power-up and stabilization of the logic power supply. Either preset signal may be used according to the requirements of the particular device desired to be preset.

The foregoing disclosure has been made with reference to discrete components and standard integrated circuits used in designing and constructing working prototypes of the remote transmitter and receiver of the present invention. Having read the foregoing detailed description, many alternate ways of providing specific functins will suggest themselves to persons skilled in the art. For example, parallel presettable shift registers may be used for parallel to serial conversion, and parallel readout shift registers may be used for serial to parallel conversion. Also, logic gates could be used to replace the diode matrix. The disclosed invention, however, comprehends the utilization of custom designed integrated circuits, each incorporating many of the disclosed circuit elements. Furthermore, upon reading the foregoing disclosure, many variations in specific circuit design and alternative embodiments will suggest themselves to persons skilled in the art. Therefore, the disclosure is intended to be illustrative and not restrictive in character.

The invention claimed is:

1. A remote control system including a remote transmitter and a receiver for remotely controlling a plurality of functions of a controlled apparatus, said transmitter comprising:
   means for selecting one of said plurality of functions to be controlled;
   means for generating pulse coded signals corresponding to selected functions;
   means for generating function level control pulses, each function level control pulse representing an increment by which the level of the selected function is to be changed; and
   means for transmitting said pulse coded signals and said function level control pulses to said receiver;
said receiver comprising:
   means for receiving transmitted pulse coded signals and function level control pulses;
   a plurality of function level setting means corresponding to said plurality of remotely controlled functions;
   means for identifying and decoding received pulse coded signals and for activating the function level setting means for the selected function; and
   means for identifying received function level control pulses and gating them to the function level setting means for the selected function;
   whereby the level of the selected function is changed in proportion to the number of received function level control pulses.

2. The invention according to claim 1 wherein the means for generating function level control pulses comprises a manually moveble member, each movement of which by a predetermined amount causes the generation of one function level control pulse.

3. The invention of claim 2 wherein the moveable member is moveable in two directions.

4. The invention according to claim 3 further comprising direction sensing means for detecting which of said two directions the moveable member is moved and for generating a first direction signal when the moveable member is moved in one direction and for generating a second direction signal when the moveable member is moved in the other direction.

5. The invention according to claim 4 wherein said direction sensing means is coupled to said means for generating pulse coded signals to cause said means for generating pulse coded signals to generate a first pulse coded signal in response to said first direction signal and a second pulse coded signal in response to said second direction signal.

6. The invention according to claim 1 wherein said means for generating pulse coded signals comprising means for generating parallel binary coded signals, a digital clock, and sequential gating means for sequentially gating a sync pulse and said parallel binary coded signals to said transmitting means under control of said digital clock whereby said sync pulse and said parallel binary signals are converted to pulse coded signals.

7. The invention according to claim 1 wherein said transmitting means comprises a first electrooptical transducer for converting electrical signals to light signals.

8. The invention according to claim 7 wherein said first electrooptical transducer is a light emitting diode.

9. The invention according to claim 7 wherein said light signals are infrared light signals.

10. The invention according to claim 7 further comprising means for interrupting said electrical signals at a radio frequency to cause said first electrooptical transducer to emit light signals chopped at said radio frequency.

11. The invention according to claim 10 further comprising means for converting said electrical pulse code signals and said electrical level control pulse signals into light signals.

12. The invention according to claim 1 wherein said receiving means comprises an electrooptical transducer for receiving light signals from said remote transmitter and converting them into electrical signals.

13. The invention according to claim 12 wherein said electrooptical transducer is a photo sensitive transistor.

14. The invention according to claim 12 wherein said receiving means further comprises an r.f. amplifier coupled to said electrooptical transducer for selectively amplifying signals at a predetermined radio frequency.

15. The invention according to claim 14 wherein said receiving means further comprises a detector coupled to said r.f. amplifier for detecting the envelope of signals at said predetermined radio frequency.

16. The invention according to claim 1 wherein said means for identifying and decoding received pulse coded signals and for activating the function level setting means for the selected function comprises means for detecting a received sync pulse, a digital clock, a digital counter for sequentially producing a plurality of enabling signals, means for enabling said clock and said counter upon the termination of a received sync pulse, sequential gating means and storage means for converting received pulse coded signals to parallel binary coded signals, decoder means for energizing one of a plurality of outputs in response to each different binary coded signal, each of said outputs operable to activate one of said function level setting means.

17. In a television remote control transmitter of the kind wherein digitally encoded pulses are utilized to select television channels for tuning and to control various television receiver functions, the improvement comprising:
a moveable member;
means coupled to said moveable member for generating electrical pulses in response to movement of said moveable member, the number of electrical pulses generated being proportional to the movement of said moveable member;
means coupled to said electrical pulse generating means for converting said electrical pulses into energy pulses suitable for wireless transmission to a receiver.

18. The invention according to claim 17 wherein said moveable member is moveable in two directions.

19. The invention according to claim 18 further comprising direction sensing means for detecting which of said two directions the moveable member is moved and for generating a first direction signal when the moveable member is moved in one direction and for generating a second direction signal when the moveable member is moved in the other direction.

20. The invention according to claim 19 further comprising means for generating pulse coded signals and wherein said direction sensing means is coupled to said means for generating pulse coded signals to generate a first pulse coded signal in response to said first direction signal and a second pulse coded signal in response to said second direction signal.

21. A remote control transmitter comprising
a. a plurality of key switches, each key switch having a first terminal and a second terminal and operable to make electrical contact between said first and second terminals;
b. a diode matrix having a plurality of input lines equal in number to the plurality of said key switches and a plurality of output lines equal in number to the number of binary digits required to uniquely identify each input line, each of said input lines being connected to the second terminal of one of said key switches;
c. a digital clock for producing a master clock signal and a pulse gating signal;
d. sequential gating means connected to the output lines of said diode matrix and to said digital clock for converting parallel binary coded signals on the output lines of said diode matrix into serial binary coded pulses;
e. a light source;
f. A first electrooptical transducer for receiving light energy from said light source and converting it into electrical energy;
g. a rotatable disc interposed between said light source and said electrooptical transducer, said disc having spaced transparent and opaque regions for alternately passing and interrupting light from said light source to said electrooptical transducer upon rotation of said disc;
h. a monostable multivibrator connected to said first electrooptical transducer for generating incrementing pulses of predetermined duration, one incrementing pulse being generated each time said disc is rotated an amount equal to one transparent portion and one opaque portion;
i. a second electrooptical transducer for converting electrical energy into light energy for transmission to a receiver;
j. driver means for said second electrooptical transducer connected to said sequential gating means, to said monostable multivibrator, and to said digital clock for pulse energizing said second electrooptical transducer at said master clock frequency in accordance with said serial binary coded pulses and said incrementing pulses.

22. A receiver for use with a remote control transmitter of the kind wherein digitally encoded pulses are utilized to select functions to be proportionally controlled and incrementing pulses are utilized to proportionally adjust the level of selected functions, said receiver comprising:
means for receiving digitally encoded pulses and incrementing pulses from a remote transmitter;
means for discriminating between digitally encoded pulses and incrementing pulses;
means for converting digitally encoded pulses into parallel digital signals;
a plurality of digital counters, one for each function to be proportionally controlled;
digital-to-analog conversion means for producing an analog control voltage proportional to the digital count in each of said digital counters;
means for decoding said parallel digital signals to selectively activate said digital counters; and
means for gating incrementing pulses to said digital counters;
whereby the digital count in said activated digital counter is incremented.

* * * * *